United States Patent
Solal et al.

(10) Patent No.: US 7,939,989 B2
(45) Date of Patent: May 10, 2011

(54) PISTON MODE ACOUSTIC WAVE DEVICE AND METHOD PROVIDING A HIGH COUPLING FACTOR

(75) Inventors: Marc Solal, Longwood, FL (US); Julien Gratier, Newton, MA (US); Robert Aigner, Ocoee, FL (US); Kevin Gamble, Apopka, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 0 days.

(21) Appl. No.: 12/564,305

(22) Filed: Sep. 22, 2009

(65) Prior Publication Data

US 2011/0068655 A1   Mar. 24, 2011

(51) Int. Cl.
H03H 9/25 (2006.01)
(52) U.S. Cl. .................................. 310/313 B; 310/313 C
(58) Field of Classification Search .............. 310/313 B, 310/313 C
See application file for complete search history.

(56) References Cited

U.S. PATENT DOCUMENTS

| | | |
|---|---|---|
| 6,441,704 B1 | 8/2002 | Ali-Hackl et al. |
| 6,777,855 B2 | 8/2004 | Bergmann et al. |
| 6,791,236 B1 * | 9/2004 | Abramov ................ 310/313 B |
| 6,922,547 B2 * | 7/2005 | O'Neill et al. ................ 455/17 |
| 6,992,547 B2 | 1/2006 | Bergmann |
| 7,170,372 B2 | 1/2007 | Ruile et al. |
| 7,449,812 B2 | 11/2008 | Hauser et al. |
| 7,459,991 B2 | 12/2008 | Ruile et al. |
| 7,477,117 B2 | 1/2009 | Pitschi et al. |
| 7,489,213 B2 | 2/2009 | Ebner |
| 7,576,471 B1 | 8/2009 | Solal |
| 2007/0018755 A1 | 1/2007 | Mayer et al. |
| 2007/0296528 A1 | 12/2007 | Kando |
| 2008/0179990 A1 * | 7/2008 | Huang et al. .............. 310/313 B |
| 2008/0309192 A1 | 12/2008 | Nakao et al. |
| 2008/0315972 A1 | 12/2008 | Mayer et al. |
| 2009/0267707 A1 * | 10/2009 | Miura et al. .................. 333/193 |

FOREIGN PATENT DOCUMENTS

| | | |
|---|---|---|
| DE | 10059533 | 6/2002 |
| DE | 10352640 | 6/2005 |
| DE | 102004037821 | 3/2006 |
| WO | 2007073722 | 5/2007 |
| WO | 2008031409 | 3/2008 |

OTHER PUBLICATIONS

Marc Solal, Olli Holmgren, Kimmo Kokkonen; "Design Modeling and Visualization of Low Transverse Modes R-SPUDT Devices"; Ultrasonics Symposium, IEEE, 2006, pp. 82-87.
Markus Mayer, Andreas Bergmann, Gunter Kovacs, Karl Wagner; "Low Loss Recursive Filters For Basestation Applications Without Spurious Modes"; Ultrasonics Symposium, IEEE, 2005; pp. 1061-1064.

* cited by examiner

*Primary Examiner* — Thomas M Dougherty
(74) *Attorney, Agent, or Firm* — Allen, Dyer, Doppelt, Milbrath & Gilchrist, P.A.

(57) ABSTRACT

An interdigital transducer includes an edge gap length between ends of electrodes and the opposing busbar increased sufficiently for reducing or even eliminating tunneling effects through the gap. As a result, a wave velocity of the acoustic wave within the longitudinally extending edge regions is less than the wave velocity within the transducer center region, and the wave velocity within the opposing gap regions is greater than a velocity in the transducer center region, thus an essentially flat propagation mode results within the aperture of the transducer. A SAW transducer or a SAW resonator on a high coupling substrate will thus guide the energy in the transducer region without a need for apodization. Higher equivalent coupling factors as well as lower losses are obtained.

23 Claims, 21 Drawing Sheets

GRATING — TRANSDUCER — DUMMY ELECTRODES — GRATING APODIZATION — V1 — V2

DUMMY ELECTRODE APODIZATION — EDGE GAP — 2p — Wd — L — Wg — Wa

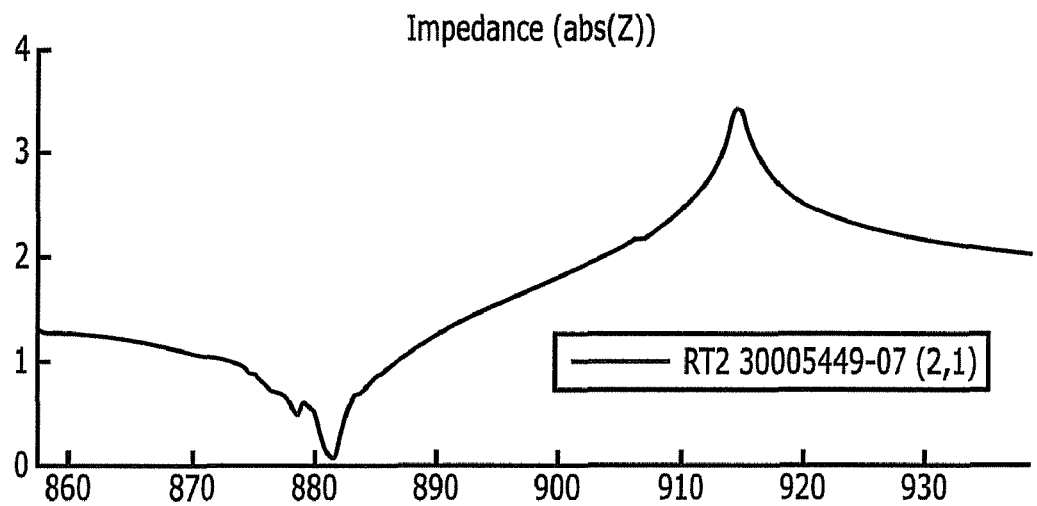
FIG. 6a.1
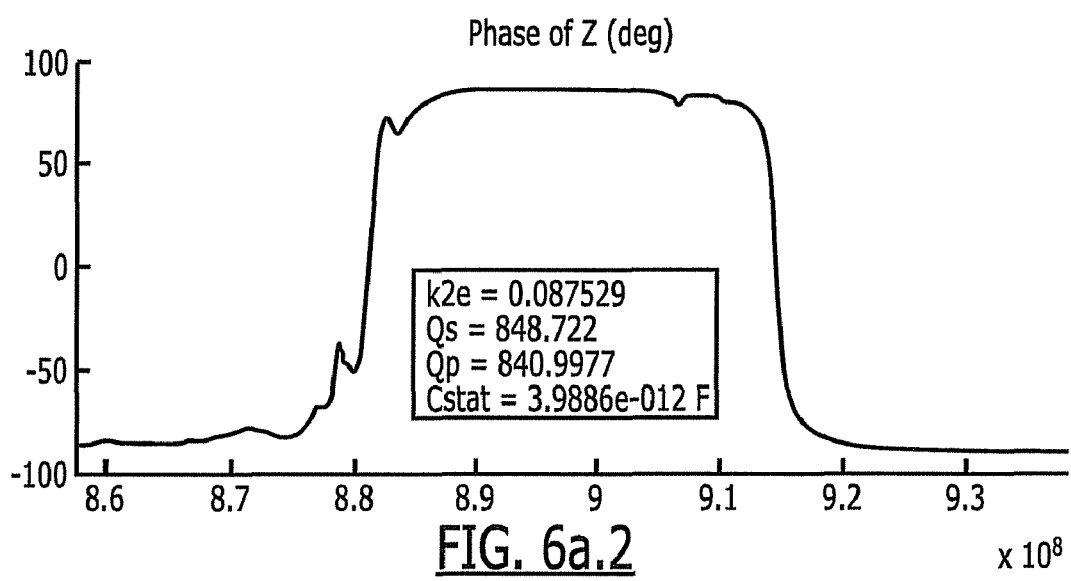
FIG. 6a.2

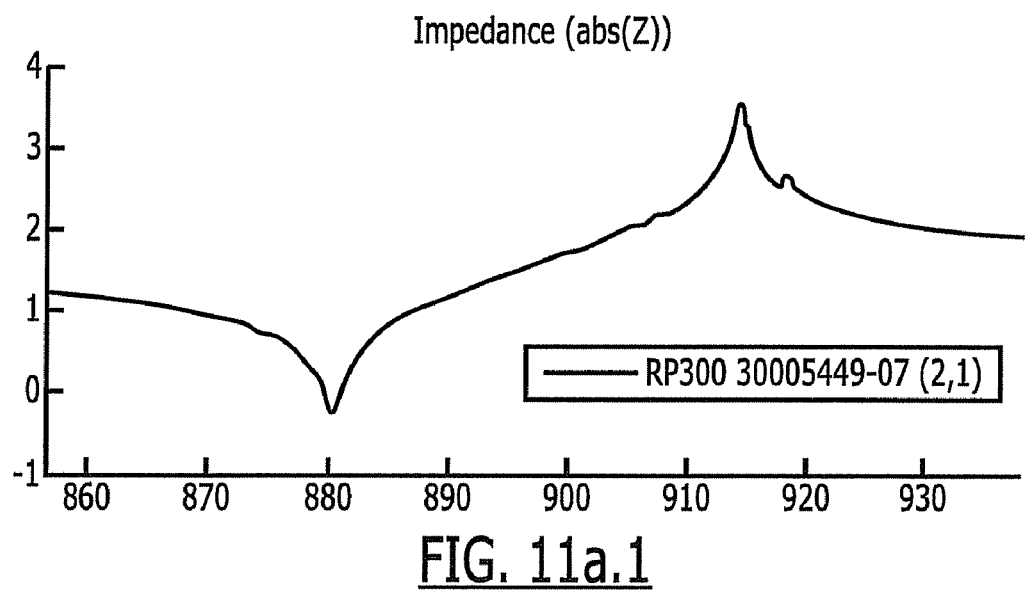
FIG. 11a.1
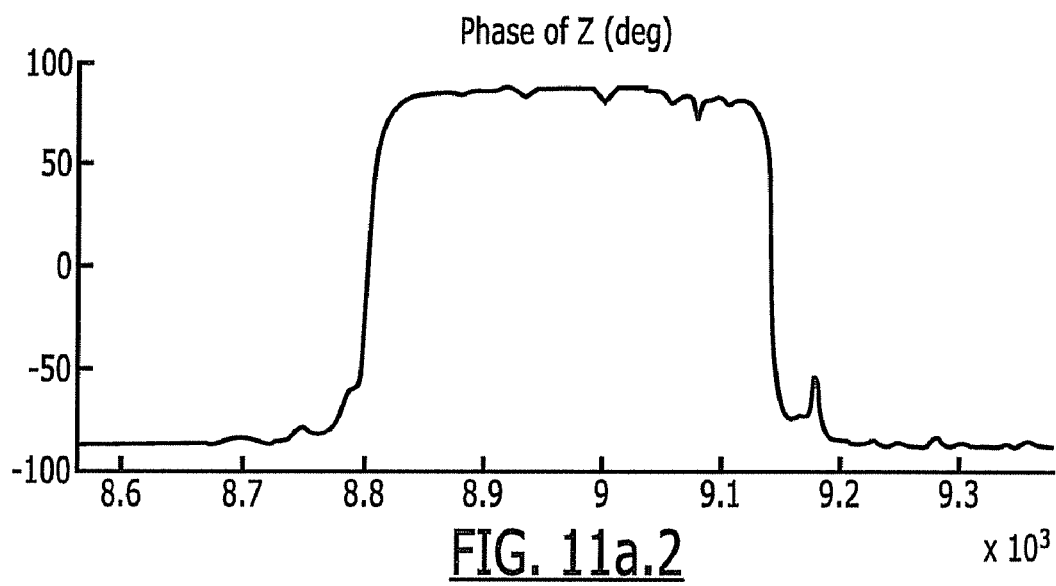
FIG. 11a.2

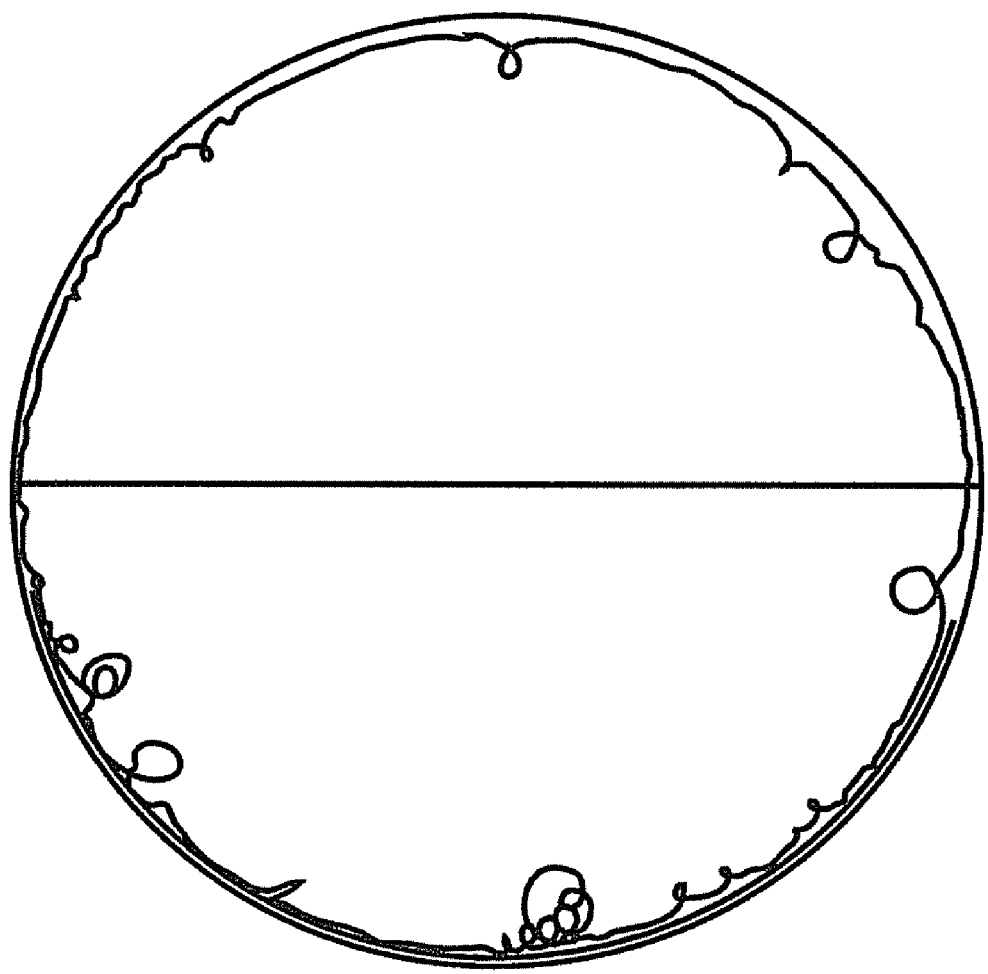
FIG. 11a.3

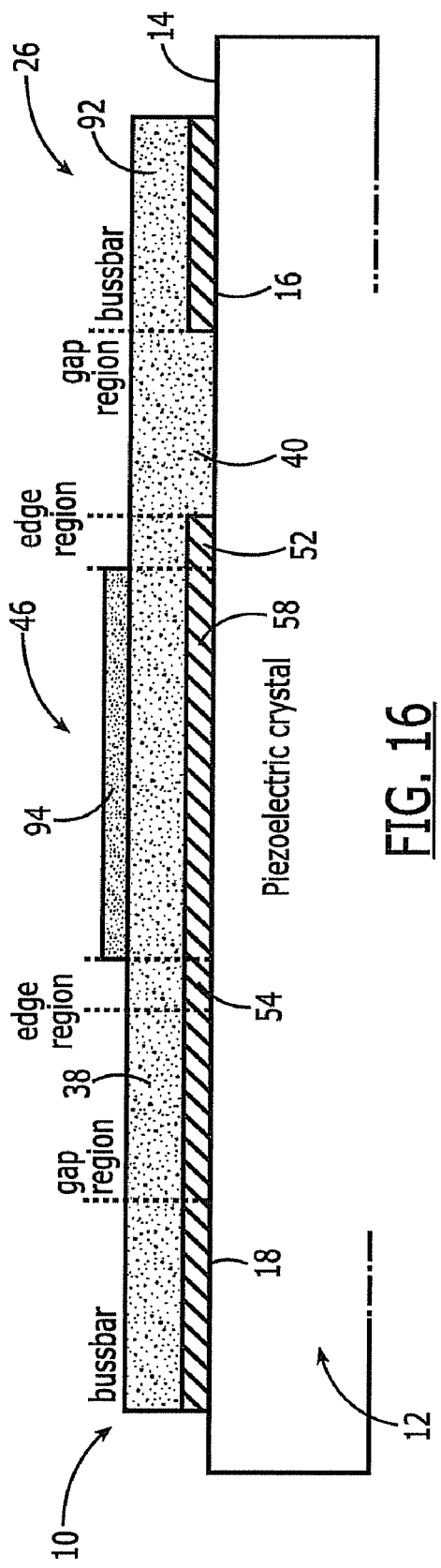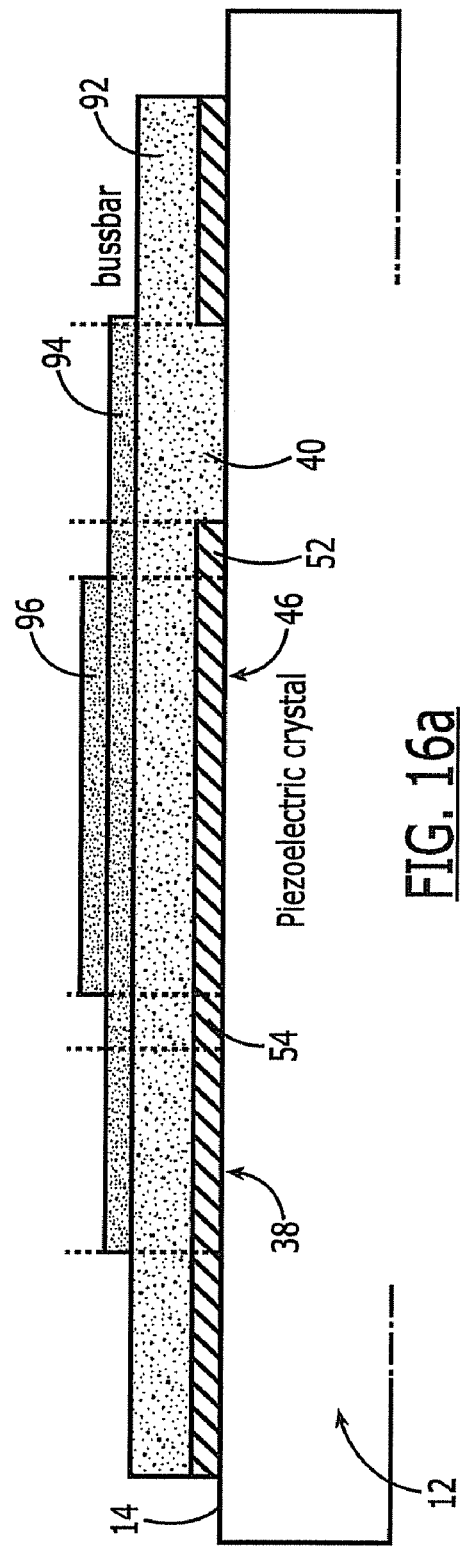

PISTON MODE ACOUSTIC WAVE DEVICE AND METHOD PROVIDING A HIGH COUPLING FACTOR

FIELD OF INVENTION

The present invention generally relates to acoustic wave devices and related methods, and more particularly to transducer electrode modifications in acoustic wave devices for providing a generally flat propagation mode inside the transducer aperture.

BACKGROUND

As herein described, reference to and the use of the terms surface acoustic wave (SAW) and SAW device are intended for any device using the propagation of elastic waves on the surface of a material or at the interface of several materials. It is to be understood that disclosure herein described may be applied to different kinds of elastic waves as long as they can be generated or detected using interdigital transducers (IDTs). For example, so called Leaky SAWs, Pseudo SAWs, Boundary Waves, Surface Transverse Waves, Interface Waves, or Love Waves are considered herein to be SAWs.

As is well known in the art, surface acoustic devices use so called interdigitated transducers (IDTs) to transform electric energy to acoustic energy, or reciprocally acoustic energy to electric energy. By way of example, the IDT illustrated with reference to FIG. 1 uses a piezoelectric substrate and two opposing busbars at two different electrical potentials and two sets of electrodes connected to the two busbars. Due to the piezoelectric effect, the electrical field between two successive electrodes at a different potential provides an acoustical source.

Reciprocally, if the transducer receives an incoming wave, charges are generated in the electrodes as a result of piezoelectric effects. A resonator is obtained by placing a transducer between two reflective gratings as illustrated with reference to FIG. 2. Filters or duplexers can be designed by connecting several resonators or by having one or several transmitting IDTs generating acoustic energy, this acoustic energy being received by one or several IDTs.

One typical problem when designing surface acoustic wave (SAW) devices, mostly on quartz, involves the elastic wave velocity in the transducer region being slower than the velocity in the busbars region. The transducers perform as a waveguide preventing the leaking of acoustic energy from the transducer and help to reduce losses. However, when this waveguide supports more than one guided mode, the device transfer function presents undesired ripples or spurii. This is generally addressed in several ways.

One simple way is to choose an acoustic aperture small enough to have only one guided mode. This may result in an excessive load or undesirable source impedances for the device. Another way includes use of an apodization of the transducer in order to try to match the transverse profile of the modes. This also results in undesirably large impedances. The use of 2-D periodic obstacles is yet another way to reduce the transverse modes, but it implies a more complicated manufacturing process. The piston mode approach relies on a change of velocity profile in the transducer in order to have one propagating mode having an essentially flat shape in the transducer aperture. This approach was described for example in U.S. Pat. No. 7,576,471, the disclosure of which is herein incorporated by reference in its entirety, for a case where the velocity is lower in the transducer than in the bus bars. In addition, due to the smaller velocities difference, the gap region has a minor impact.

For wideband devices, a high piezoelectric coupling material such as Lithium Niobate or Lithium Tantalate has to be used. In this case, the transducer configuration can be different than the usual configuration on quartz. If the velocity of the acoustic wave in the busbars is slower than the velocity of the wave in the transducer, it no longer performs as a desirable waveguide, thus transverse modes are no longer possible. This also allows the acoustic energy to leak outside the transducer and can result in losses.

In practice, the situation is more complicated. For high coupling substrates, the electrical conditions at the surface have a large impact on the velocity and the velocity in the electrode end gaps is usually much larger than the velocity in the transducer aperture and larger than the velocity in the busbars. The length of the gaps is usually of the same order of magnitude as the electrode width, typically a fraction of the acoustic wavelength. In this case, both transverse modes due to the reflections on the edge gaps and energy leaking outside the transducer result. The velocity difference between the transducer region and the gap region is large enough to have a full reflection on the edges while the edge gap is small enough so that some energy is leaking outside by a tunnel effect.

To suppress the unwanted transverse modes, one typical method includes use of apodization, as illustrated with reference to FIG. 3. In this case, the position of the edge gap extends into the transducer aperture region. Since the position of the gap has a large impact on the modes, the mode shapes are varying along the transducer length. As a result, undesired transverse modes occur at different frequencies and their desired effect is reduced.

Similarly, Ken Hashimoto in [T. Omori, †K. Matsuda, Y. Sugama, †Y. Tanaka, K. Hashimoto and M. Yamaguchi, "Suppression of Spurious Responses for Ultra-Wideband and Low-Loss SAW Ladder Filter on a Cu-grating/15°YX-LiNbO3 Structure", 2006 IEEE Ultrasonics symp., pp 1874-1877] presented a transducer where the gap position is constant while the aperture is changing in the transducer, as illustrated with reference to FIG. 4. This may be referred to as dummy electrodes apodization. This transducer is working by changing the transverse modes frequencies along the transducer.

By way of further example, a patent application of Murata [US2007/0296528A1] describes a SAW transducer that has wider electrodes in front of the edge gap to try to reduce the velocity difference between the edge gap region and the transducer aperture region, as illustrated with reference to FIG. 5. Another Murata patent application [US2008/0309192 A1] discloses a modified version of the apodization using a function with more than one extreme, as illustrated with reference to FIG. 6. Performance characteristics including phase and impedance for such are illustrated with reference to the plots of FIG. 6a.

SAW transducers often use so called "dummy electrodes" as further illustrated with reference again to FIG. 3. These dummy electrodes are used to suppress a velocity difference between the active region of the transducer and the inactive region of the transducer, especially when apodization is used.

Typically, the electrode end gap separating the dummy electrode from the active electrode is chosen in the order of magnitude of the electrode width (a fraction of wavelength) in order to reduce its effect as much as possible. When a high coupling material is chosen, the velocity in the gap is much higher than the velocity in the transducer. In this case, even if the gap length is small, it is found that the gap position has a very large impact on the transverse modes.

All these teachings try to reduce undesirable effects of the edge gap of the transducer. Even if good quality factors were demonstrated, the apodization results in an undesirable reduction of the equivalent coupling coefficient. In addition, the wave velocities are such that wave guiding is not possible for the transducer, and otherwise useful energy leaks outside the transducer.

SUMMARY

An interdigital transducer includes an edge gap length between ends of electrodes and the opposing busbar increased sufficiently for reducing or even eliminating tunneling effects through the gap . An desirably flat propagation mode results within the transducer center region when physical characteristics of transducer electrodes within edge regions are modified such that the wave velocity of the acoustic wave within the longitudinally extending edge regions is less than the wave velocity within the transducer center region, and the wave velocity within the opposing gap regions is greater than a velocity in the transducer center region. Additionally, when the physical characteristics of the transducer in the edge region is modified such that the wave velocity of the acoustic wave within the longitudinally extending edge regions is less than the wave velocity within the transducer center region, and the wave velocity within the opposing gap regions is greater than a velocity in the transducer center region, then an essentially flat propagation mode results within the aperture of the transducer. Since the amplitude if this mode is matched to the amplitude of the electroacoustic sources, it will be excited preferentially. A SAW transducer or a SAW resonator on a high coupling substrate will thus guide the energy in the transducer region without a need for apodization. Higher equivalent coupling factors as well as lower losses are obtained. The physical characteristics of the edge regions can be modified by either changing the electrode dimensions, or adding a dielectric layer or metal layer at the edge region or center region. One embodiment of the invention may include an acoustic wave device comprising a piezoelectric substrate having a surface for supporting an acoustic wave, first elongate busbar and an opposing second elongate busbar extending generally parallel to a longitudinal path of the acoustic wave, a plurality of first electrodes electrically connected to and extending transversely from the first buss bar, and a plurality of second electrodes electrically connected to and extending from the second busbar. The opposing busbars and the plurality of electrodes form an interdigital transducer carried on the piezoelectric substrate for supporting the acoustic wave, wherein each of the plurality of the electrodes has a first end electrically connected to one of the first and second busbars and an opposing second end having an edge spaced from the opposing busbar so as to form a gap between the edge of each electrode and the opposing busbar, the gaps proximate the opposing busbars forming a gap region extending longitudinally along the transducer and should be at least an acoustic wavelength in length dimension, the plurality of electrodes further defined by a first transversely extending portion proximate the electronically connected busbar and generally contained within the gap region, a second transversely extending portion proximate the edge and defining an edge region extending longitudinally along the transducer, and a third transversely extending portion of the electrode there between, the third transversely extending portion defining a transducer center region, the second transversely extending portions within the edge regions having a physical characteristics that is different than the third transversely extending portion within the transducer center region such that the wave velocity of the acoustic wave within the longitudinally extending edge regions is less than the wave velocity within the transducer center region, and wherein the wave velocity within the opposing gap regions is greater than a velocity in the transducer center region.

One embodiment may comprise a surface acoustic wave device including a piezoelectric substrate having a surface for propagating acoustic waves, a first elongate busbar and an opposing second elongate busbar extending generally along a longitudinal path of the acoustic waves, a plurality of first electrodes electrically connected to and extending transversely from the first buss bar, a plurality of second electrodes electrically connected to and extending from the second busbar, wherein the opposing busbars and the plurality of electrodes form an interdigital transducer carried on the piezoelectric substrate for the propagating acoustic waves, wherein each of the plurality of the electrodes has a first end electrically connected to one of the first and second busbars and an opposing second end having an edge spaced from the opposing busbar so as to form a gap between the edge of each electrode and the opposing busbar, the gaps proximate the opposing busbars forming a gap region extending longitudinally along the transducer, and wherein a length dimension of the gap is at least one wavelength for the propagating acoustic waves, and one of a dielectric or metal layer extending longitudinally along the transducer, the dielectric or metal layer covering the electrode portions within the transducer center region. A dielectric layer is addressed by way of example, but it is understood that the layer may be one of a dielectric layer, a metal layer, or a combination thereof. In another embodiment two dielectric layers extending longitudinally along the transducer, a first dielectric layer covering the transducer and a second dielectric layer extending longitudinally along the transducer, the second dielectric layer covering only the electrode portions within the transducer center region. Yet another embodiment comprises several dielectric layers, a first dielectric layer covering the transducer, a second dielectric layer extending longitudinally along the transducer, the second dielectric layer covering the electrode portions within the gap, edge and center regions. In all the above mentioned embodiments, the velocity of the acoustic waves within opposing gap regions is greater than a velocity in a transducer center region between the gap regions, and the velocity in the edge regions is slower than the velocity in the center region wherein an essentially flat propagation mode results within an aperture of the transducer.

Yet another embodiment according to the teachings of e present invention may comprise a surface acoustic wave device including a piezoelectric substrate having a surface for propagating acoustic waves, a first elongate busbar and an opposing second elongate busbar extending generally parallel to a longitudinal path of the acoustic waves, a plurality of first electrodes electrically connected to and extending transversely from the first buss bar, and a plurality of second electrodes electrically connected to and extending from the second busbar, wherein the opposing busbars and the plurality of electrodes form an interdigital transducer carried on the piezoelectric substrate for the propagating acoustic waves, wherein each of the plurality of the electrodes has a first end electrically connected to one of the first and second busbars and an opposing second end having an edge spaced from the opposing busbar so as to form a gap between the edge of each electrode and the opposing busbar, the gaps proximate the opposing busbars forming a gap region extending longitudinally along the transducer, wherein a length dimension of the gap is at least three times a wavelength for the propagating acoustic waves and the physical characteristic of the edge regions being different than the center region.

One embodiment may comprise an acoustic wave device having a piezoelectric substrate having a surface for supporting an acoustic wave, an interdigital transducer carried on the piezoelectric substrate for supporting the acoustic wave, and first and second gratings carried on the surface of the substrate on opposing longitudinal ends of the interdigital transducer. Each of the gratings and transducer may include a first elongate busbar and an opposing second elongate busbar extending generally along a longitudinal path of the acoustic wave, a plurality of first electrodes electrically connected to and extending transversely from the first buss bar, and a plurality of second electrodes electrically connected to and extending from the second busbar. Each of the plurality of the electrodes has a first end electrically connected to one of the first and second busbars and an opposing second end having an edge spaced from the opposing busbar so as to form a gap between the edge of each electrode and the opposing busbar, the gaps proximate the opposing busbars forming a gap region extending longitudinally along the transducer, wherein the gap is larger than a wavelength for the acoustic wave. As a result, a velocity of the acoustic wave within opposing gap regions is greater than a velocity in a transducer center region between the gap regions, and desirably a propagation mode essentially flat propagation mode results within an aperture of the transducer.

BRIEF DESCRIPTION OF THE DRAWINGS

For a fuller understanding of the invention, reference is made to the following detailed description, taken in connection with the accompanying drawings illustrating various embodiments of the present invention, in which:

FIG. 6*a*: of a resulting impedance and phase characteristics for double triangular apodization;

FIG. 11*a* illustrates characteristic data for the resonator of FIG. 11, wherein the period of the resonator is 2 μm and the edge length is 3 μm;

FIG. 16 illustrates a cross section along an electrode view of an embodiment of the present invention buried in silicon oxide, wherein a fast dielectric material on top of the transducer center provides a desired velocity configuration;

FIG. 16*a* is a diagrammatical illustration of one embodiment viewed in cross section along an electrode view of a device buried in silicon oxide, a fast dielectric is used to obtain a desired velocity configuration, wherein to ease the frequency trimming process, this fast material is added on the full transducer surface (gap/edge/transducer) while more material is added on the center, and wherein if some fast material is removed, the difference in the thickness of fast material will remain constant and the velocity difference will stay as that desired;

DETAILED DESCRIPTION OF EMBODIMENTS

The present invention will now be described more fully hereinafter with reference to the accompanying drawings, in which alternate embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

To restate a problem by way of example for a case where a high coupling substrate is used, one difficulty when designing a SAW resonator or SAW transducer is the presence of the electrode edge gap region that has a velocity much higher than the transducer aperture region. This is especially a problem when Rayleigh waves or Love waves are used. In particular, this difficulty generally occurs with a Lithium Niobate substrate having an orientation in the vicinity of Y+128 deg. or in the vicinity of Y+15 deg. These orientations are often used in conjunction with a silicon oxide dielectric layer or overcoat to reduce the temperature sensitivity. Often a heavy electrode metal like Cu is used in order to increase the acoustic reflectivity.

In this case, the mode shapes and frequencies are depending strongly on the gap position in the transducer region. When using apodization, these mode shapes and velocities are changing along the transducer since the position of the gap changes. This results in mode conversion and in losses between regions having different gap positions. Furthermore, the apodization reduces the equivalent piezoelectric coupling of the device. In the usual case for high coupling substrates, when the velocity in the busbars is lower than the velocity in the transducer, there is no guiding in the transducer region and energy leaks outside, resulting also in losses and in degradation of the quality factor.

By way of example, embodiments of the invention herein described provide ways to make a SAW transducer or a SAW resonator on a high coupling substrate while guiding the energy in the transducer region and without a need for apodization. Higher equivalent coupling factors as well as lower losses are obtained.

As an alternative to apodization, it is desirable to insure a guiding in the transducer region. For embodiments of the invention herein described by way of example, the edge gap length is increased sufficiently for reducing or even eliminating tunneling effects through the gap.

Figure 8:
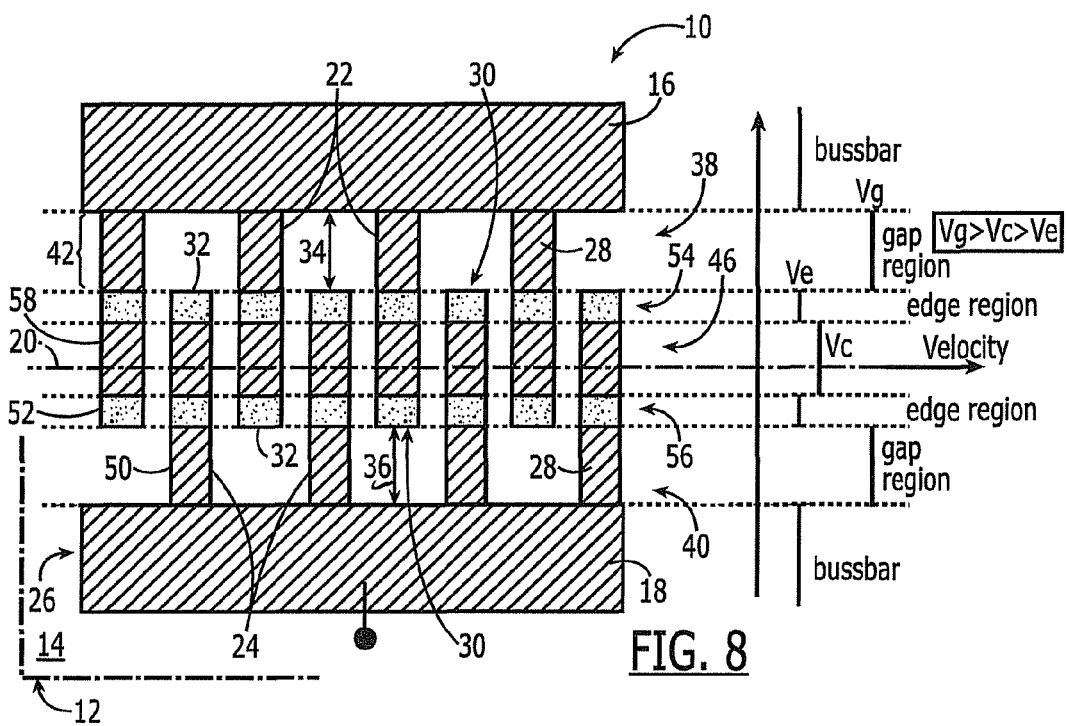
FIG. 8 is a diagrammatical illustration of a transducer according to the teachings of the invention having a long gap edge region and the edge region physically different from a center region, long gap edge region having a lower velocity profile than the center region and than that of the gap region.

With reference now to FIG. 8, embodiment of the invention may be described as an acoustic wave device 10 comprising a piezoelectric substrate 12 having a surface 14 for supporting an acoustic wave. A first elongate busbar 16 and an opposing second elongate busbar 18 extend generally along a longitudinal direction 20 of the acoustic wave. A plurality of first electrodes 22 is electrically connected to and extend generally transversely from the first busbar 16, and a plurality of second electrodes 24 is electrically connected to and extend from the second busbar 18. The opposing busbars 16, 18 and the plurality of electrodes 22, 24 form an interdigital transducer (IDT) 26 carried on the surface 14 of the piezoelectric substrate 12 for supporting the acoustic wave.

With continued reference to FIG. 8, each of the plurality of the electrodes 22, 24 has a first end 28 electrically connected to one of the first and second busbars 16, 18 and an opposing second end 30 having an edge 32 spaced from the opposing busbar 16, 18 so as to form gaps 34, 36 between the edge of each electrode 22, 24 and the opposing busbar 16, 18. The gaps 34, 36 proximate the opposing busbars 16, 18 form gap regions 38, 40 extending longitudinally along the transducer 26 and generally parallel with each other.

For embodiments of the invention, and as will be further detailed below, the gaps 34, 36 are larger in their length dimension 42 than one wavelength of the acoustic wave being propagated within the IDT 26. More than one and up to three wavelengths has been shown to be desirably effective. Further, each of the plurality of electrodes 22, 24 defined by a first transversely extending electrode portion 50 proximate the associated electronically connected busbar 16, 18 and generally contained within the gap regions 38,40 and a second transversely extending electrode portion 52 proximate the edge 32 and defining edge regions 54, 56 extending longitudinally along the transducer 26. A third transversely extending electrode portion 58 of the electrodes 22, 24 extends between the first and second transversely extending electrode portions 50, 52. The third transversely extending electrode portion 58 is entirely within the transducer center region 46.

Figure 1:
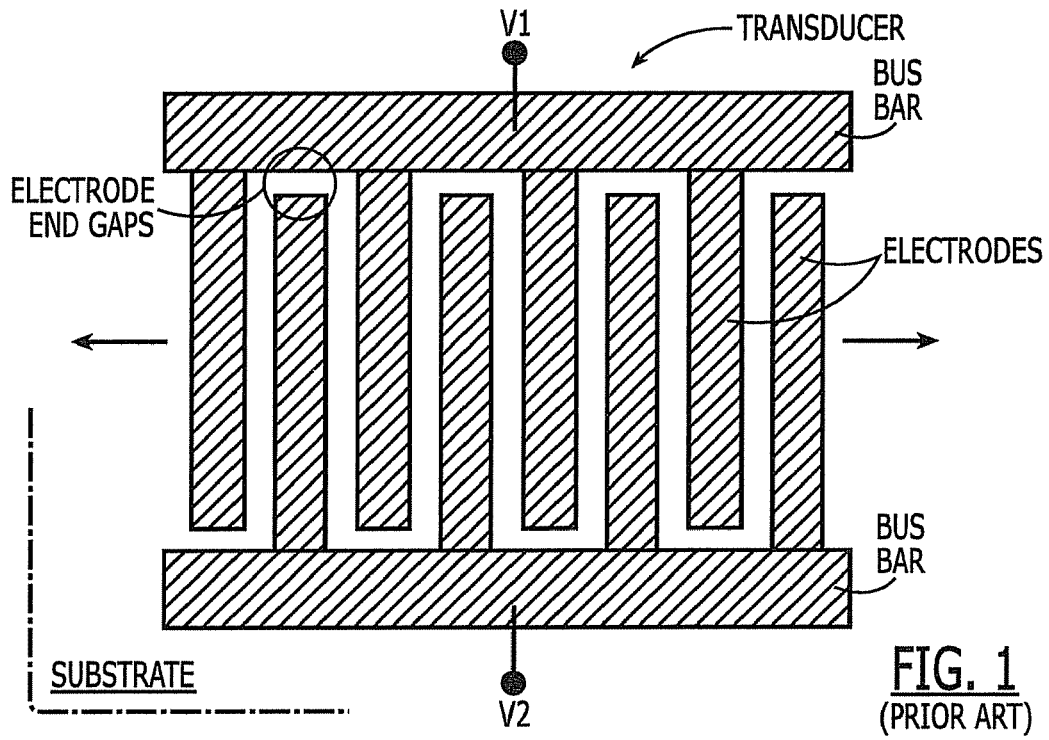
FIG. 1 is a diagrammatical illustration of an interdigital transducer (IDT)
Figure 2:
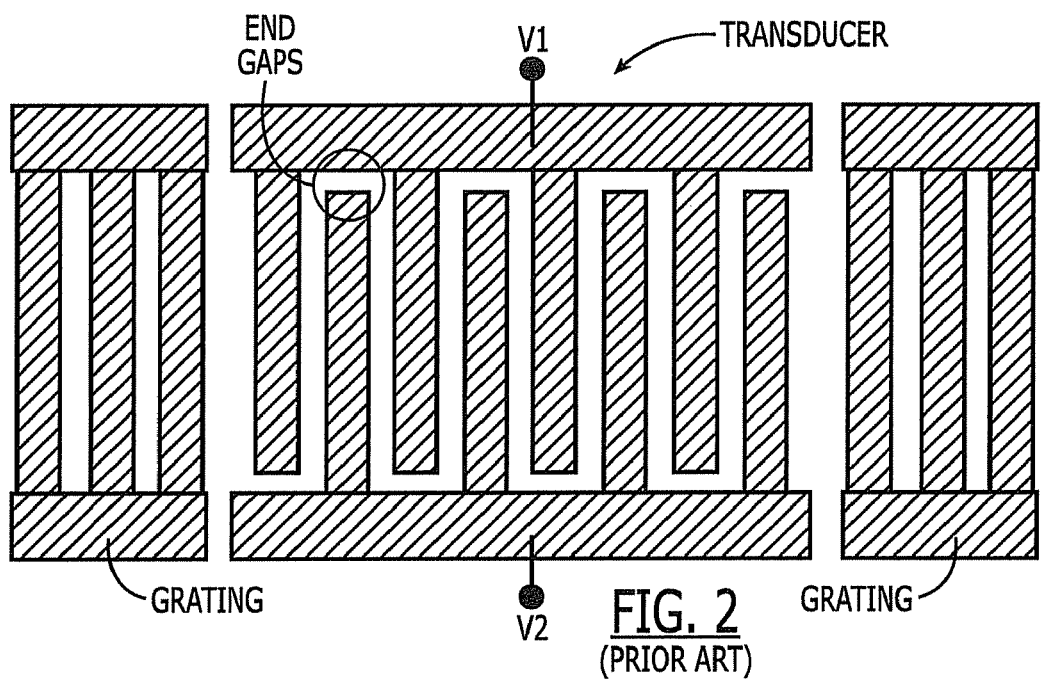
FIG. 2 a diagrammatical illustration of a SAW resonator.
Figure 3:
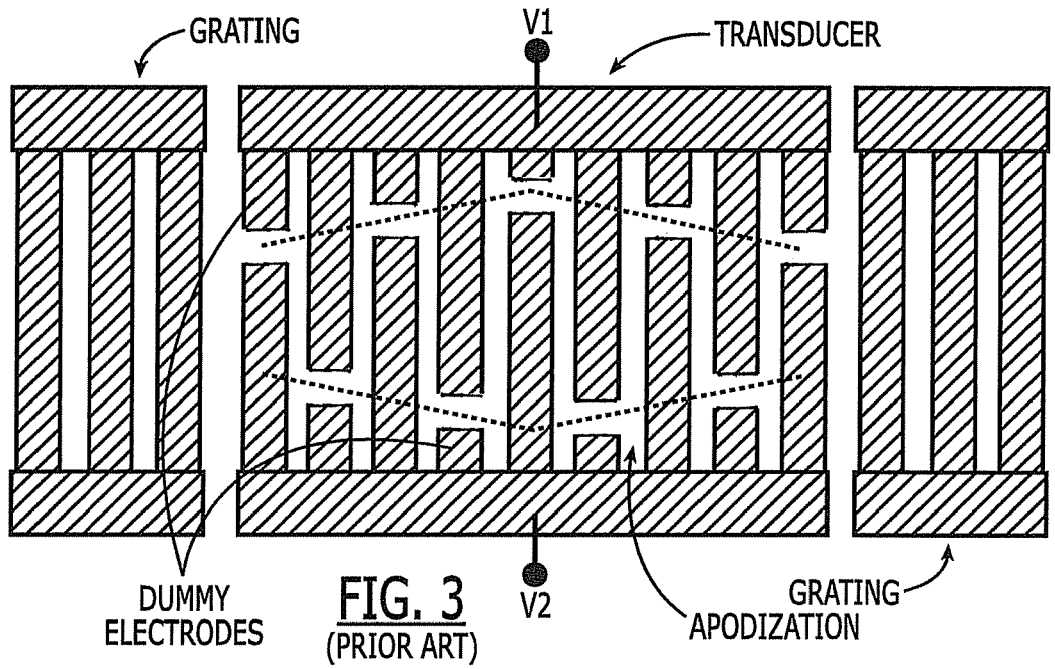
FIG. 3 is a diagrammatical illustration of a SAW resonator with triangular apodization of elements.
Figure 4:
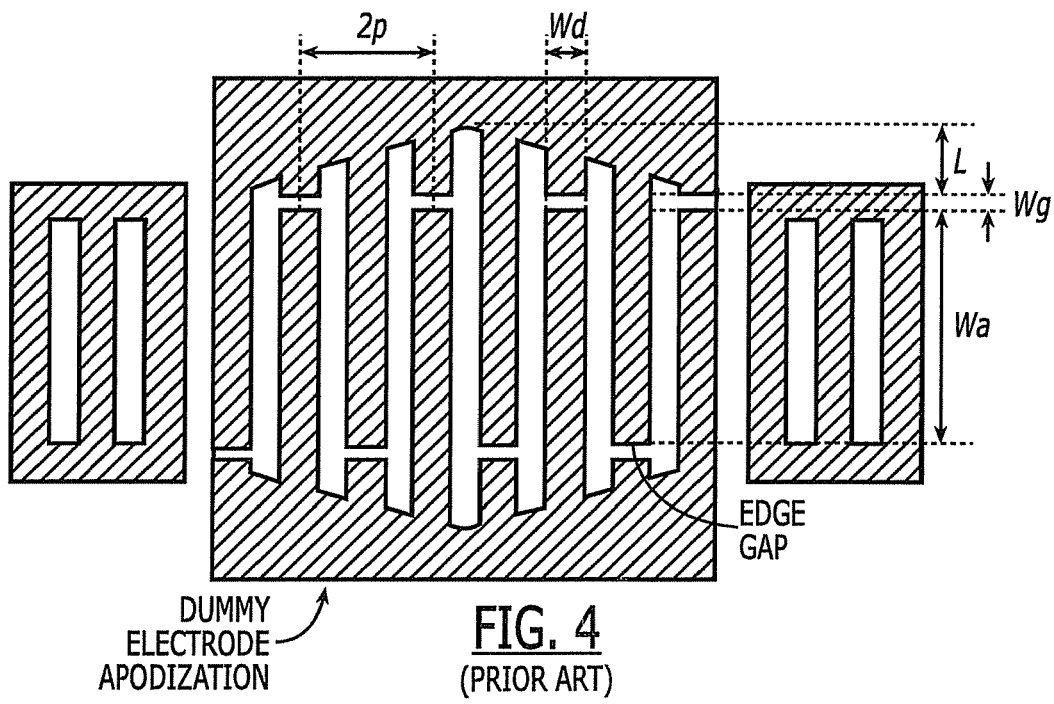
FIG. 4 is a diagrammatical illustration of a SAW resonator including a dummy electrode apodization.
Figure 5:
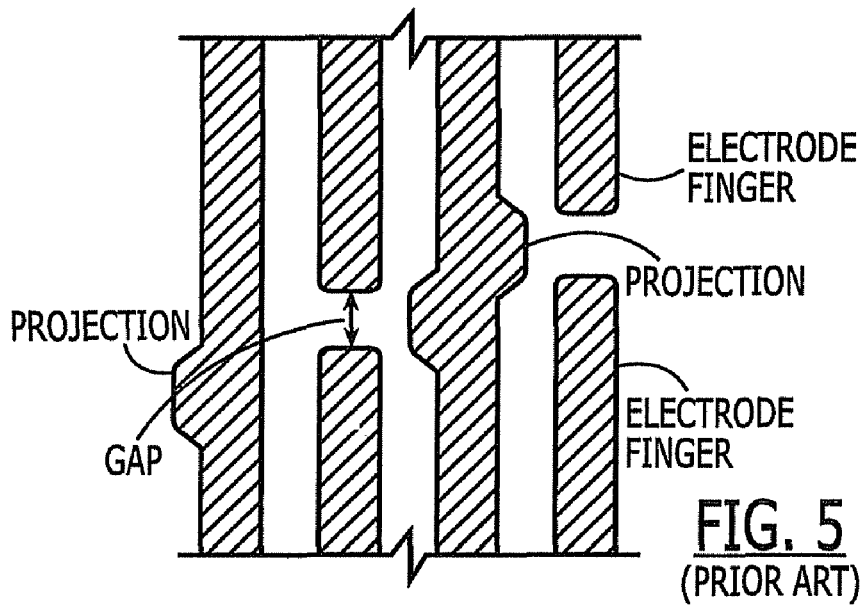
FIG. 5 is a diagrammatical illustration of an IDT configuration for reducing a velocity in a gap region.
Figure 6:
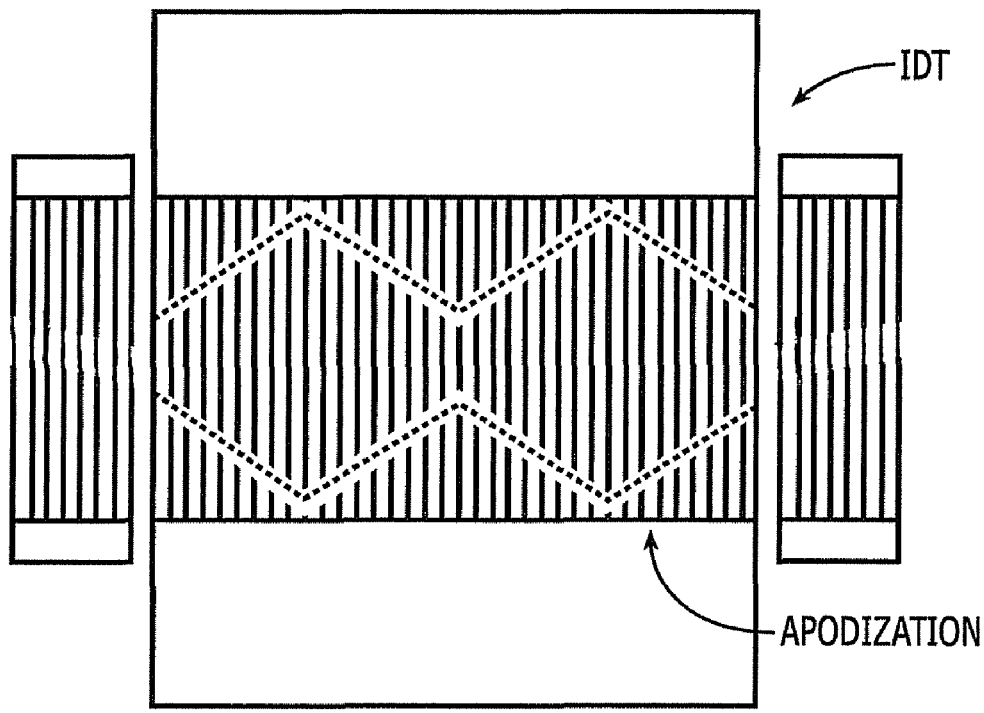
FIG. 6 is a diagrammatical illustration of a transducer having a double triangular apodization.
Figure 7:
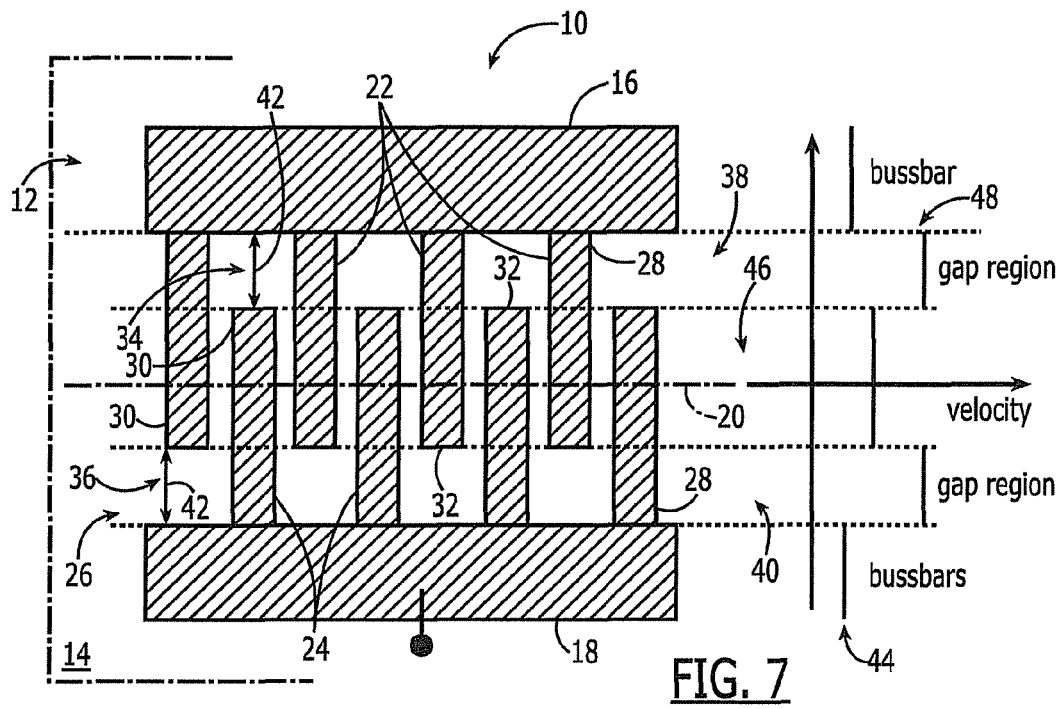
FIG. 7 is a diagrammatical illustration of a transducer having a long gap and a corresponding velocity profile within elements thereof.

As further illustrated with reference to FIG. 7 and to FIG. 8 as one preferred embodiment of the invention, the physical characteristics of the edge regions 54, 56 are different from the physical characteristics of the electrode portions 58 in the center region 46 with the result that the edge region wave velocity(Ve) is less than the center region wave velocity(Vc) while a velocity 44 of the acoustic wave within opposing gap regions 38, 40 is greater than a velocity in a transducer center region 46 between the opposing gap regions. By way of example with reference to FIG. 9, the second transversely extending electrode portion 52 within the opposing edge regions 54, 56 may have its width dimension 60 greater than the width dimension 62,64 of the first and third transversely extending electrode portions 50, 58 within the gap regions 38, 40 and the transducer center region 46, respectively, so as to provide an increased duty factor and thus the wave velocity 44 within the edge regions 54, 56 less than the wave velocity within the transducer center region 46. The physical characteristics of the edge regions being different than that of the center transducer region with respect to the duty factor of the transducer.

An essentially flat propagation mode results within an aperture 48 of the transducer 26. One embodiment of the invention as herein described with reference again to FIG. 9 includes the gap length dimension at least three times greater than a wavelength being propagated by the IDT.

Long end gaps 34, 36 are herein disclosed. "Long" is herein used to denote a length dimension of the gap at least a length of a wavelength for the propagating waves and larger than that typically used in SAW devices. An edge gap length larger than or at least one wavelength results in a desirable wave guiding. An edge gap length larger than three wavelengths allows for a further improved wave guiding. In this case, very strong transverse modes are obtained, as illustrated with reference to FIG. 8. Despite these strong transverse modes, the energy is confined inside the transducer, thus getting low losses. To reduce the transverse modes, a lower velocity in the edge provides a mode essentially flat in the transducer region. This can be done for example by increasing the duty factor at the edge of the electrodes. A flat mode, a so-called piston mode, is obtained. The other modes are almost not excited since the source profile matches almost perfectly the mode shape.

Figure 10:
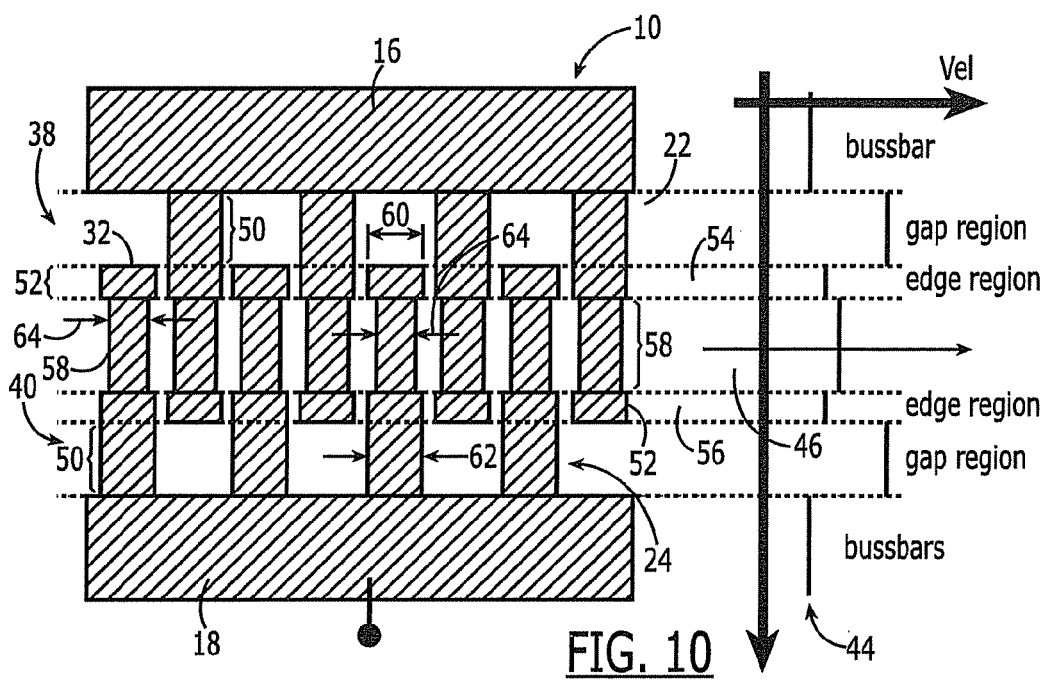
FIG. 10 illustrates one example of a transducer with a long edge gap and modified edge region, wherein the electrode width in the gap region is the same as in the edge region.

With reference now to FIG. 10, one embodiment of the device 10 further includes each of the plurality of electrodes 22, 24 defined by a first transversely extending electrode portion 50 proximate the associated electronically connected busbar 16, 18 and generally contained within the gap regions 38,40 and a second transversely extending electrode portion 52 proximate the edge 32 and defining edge regions 54, 56 extending longitudinally along the transducer 26. A third transversely extending electrode portion 58 of the electrodes 22, 24 extends between the first and second transversely extending electrode portions 50, 52. The third transversely extending electrode portion 58 is entirely within the transducer center region 46.

For the embodiment herein described with continued reference to FIG. 10, the first and second transversely extending electrode portions 50, 52 within the gap regions 38, 40 and edge regions 54, 56, respectively, have width dimensions 60, 62 greater than a width dimension 64 of the third transversely extending electrode portion 58 that is within the transducer center region 46 so as to provide an increased duty factor and thus the wave velocity 44 within the longitudinally extending edge regions less than the wave velocity within the transducer center region.

FIG. 10 illustrates another embodiment of the invention wherein long end gaps 34, 36 are used for allowing a guiding within the transducer. To reduce transverse modes, the velocity in the edges of the transducer is reduced by an increasing of a duty factor for the finger element portions within the edge regions 38, 40. For the case of FIG. 9, the duty factor in the gap is the same as in the edge region, while the duty cycle is the same for the gap as in the center region for the embodiment of FIG. 10.

Figure 9:
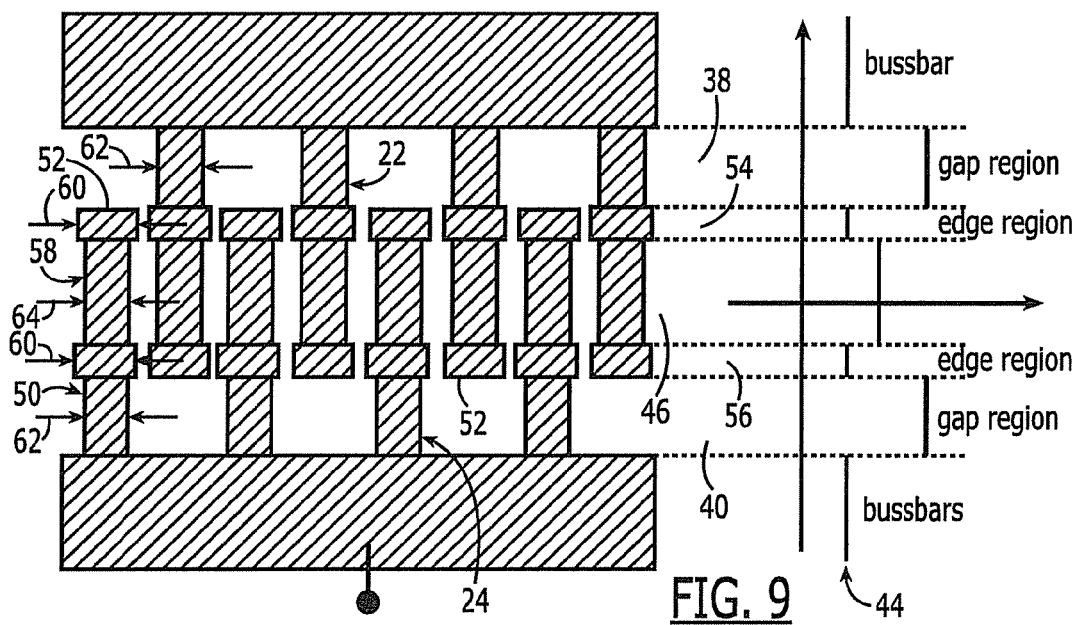
FIG. 9 is an example of a transducer with long edge gap and modified edge region, wherein the electrode width in the gap region is the same as in the transducer region.

Both configurations for the embodiments of FIGS. 9 and 10 work as well as other configurations when the average velocity 44 in the gap regions 38, 40 is larger than the velocity in the transducer aperture center region 46 and the velocity in the edge regions is lower than the velocity in the center region. The length of the edge region and its velocity are adjusted to obtain a mode essentially flat in the transducer center region in order to excite preferentially this mode. It is important to understand that the important parameters for the invention to work are the average velocities in the different regions. It means that a similar result will probably obtained even if the successive electrodes regions are not physical identical (different widths for example) as long as the average velocities are slower in the edge regions than in the center region and faster in the gap regions than in the center region. In addition, it is also understood that the opposed bus bars do not have to be strictly parallel. If the gap region is large enough, then the acoustic energy in the bus bars may be neglected and their exact layout has only a minor impact on the device performances.

Figure 11:
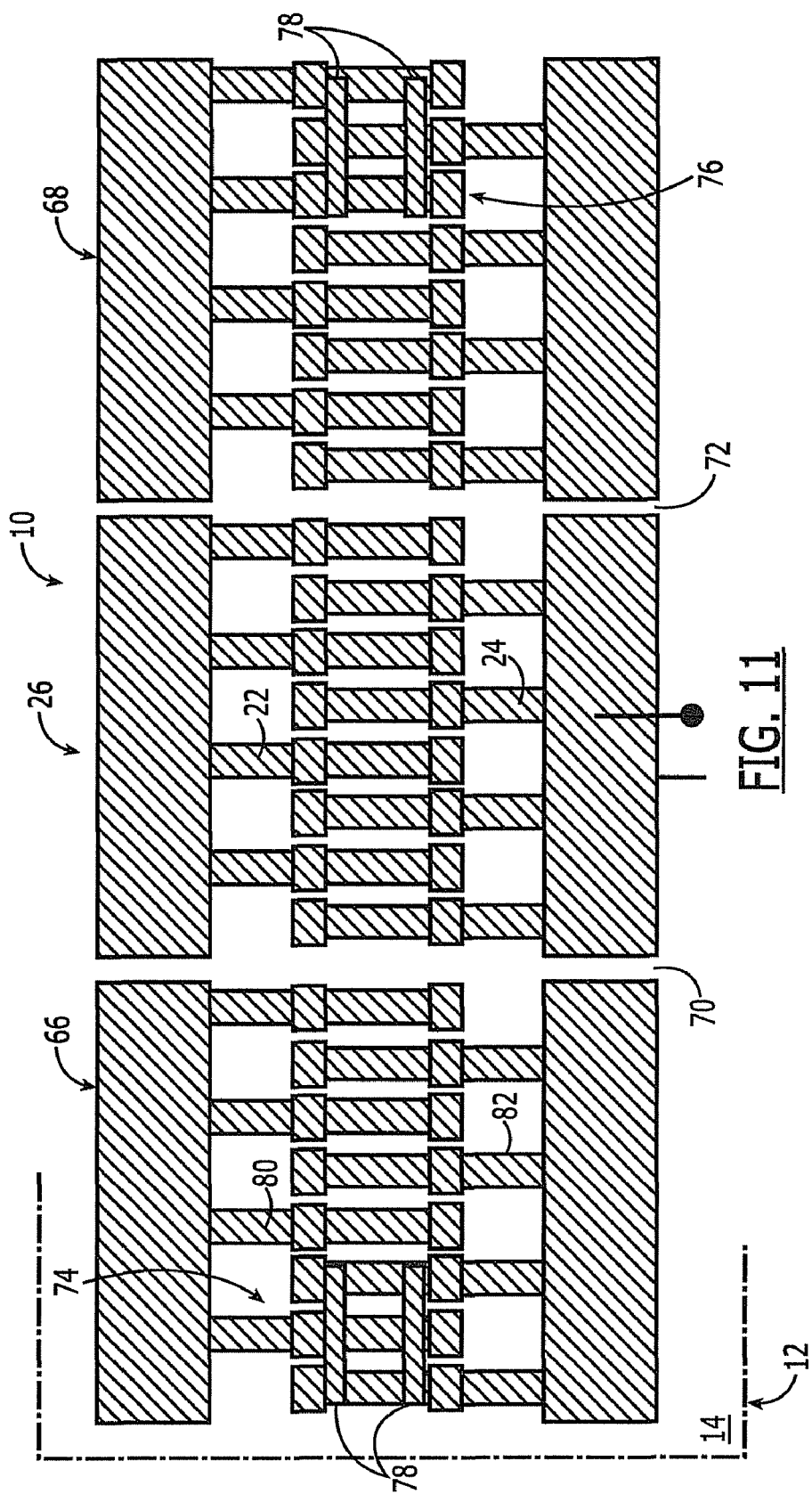
FIG. 11 illustrates one example of a resonator with reduced transverse mode and improved Q, wherein two gratings have the same acoustical structure as the transducer except they are short circuited, and wherein the short circuit results from adding connection in the gratings on the external side thereof.

As illustrated with reference to FIG. 11, the device 10 may further comprise first and second gratings 66, 68 carried on the surface 14 of the substrate 12 on opposing longitudinal ends 70, 72 of the interdigital transducer 26. Yet further, preselected electrodes 74, 76 within the opposing gratings 66, 68 and most removed from the transducer 26 are electrically connected via connecting bars 78 so at to be short circuited. As illustrated with continued reference to FIG. 11, while not limited to such a structure, the first and second gratings 66, 68 may have an electrodes 80, 82 structured as the electrodes 22, 24 within the transducer 26.

To avoid any mode conversion at the separation between the gratings 66, 68 and the transducer 26, the gratings are similar to the transducer except the gratings are short circuited to avoid a regeneration of acoustic energy. The short circuit can be done by using an addition of metallic connections of the electrode or externally. It is desirable to place the additional connections on the outside of the reflector, i.e. where the acoustic energy is the lowest and so the impact is the lowest.

FIG. 11a illustrates an impedance curve obtained with a resonator of the invention as shown in the embodiment of FIG. 9. The substrate was a Y-cut 128° Lithium Niobate. the electrodes were composed of copper metal and buried inside a silicon oxide layer. The metal thickness was 2500 A while the oxide thickness was 1 um. The period of the transducer and the reflectors is 2 um. The duty factor in the transducer was 50% while it was 75% in the edge and in the gap. The resonator comprised 200 active electrodes. The active aperture was 80 µm while the gap region was varied between 20 µm and 40 µm. As illustrated, desirable results were obtained for an edge length between 2 µm and 5 µm um, i.e. between 0.75 and 1.2 times the wavelength. The obtained quality factor was 1252 at resonance and 1424 at antiresonance. The modes are attenuated. By comparison, for the same metal and oxide the quality factor are lower than 850 when using a triangle apodization. This shows the superiority of the proposed embodiment.

Figure 12:
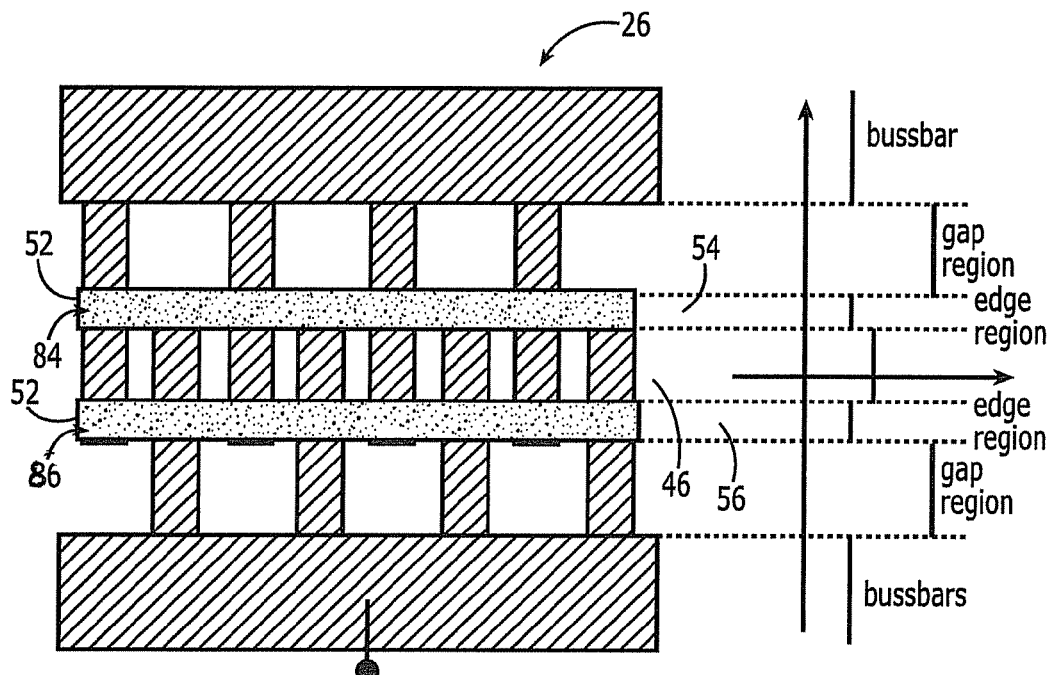
FIG. 12 is a diagrammatical illustration of a transducer without dummy electrodes and with a dielectric layer or metal layer on top for reducing velocity in the edge regions.

With reference now to FIG. 12, the acoustic wave device 10 above described may comprise the transducer 26 having dielectric or metal layers 84, 86 extending longitudinally along the transducer 26, wherein the dielectric layers only cover the electrode portions 52 within the edge regions 54, 56 and not the transducer center region 46. This alternate embodiment to reduce the velocity in the edge regions includes adding the dielectric layer in the edge regions. As well, a metal could be added in the edges above or below the electrodes. Alternatively, a layer having a fast acoustic velocity, for example Aluminum Nitride or Silicon Nitride, can be added in the center region as shown on FIG. 13. A similar acoustic velocity configuration is obtained with the lowest velocity in the edge, a high velocity in the gap and a velocity higher than the velocity in the edge in the center. An adequate choice of the layer thickness and/or the edge width can be done to obtain a flat propagation mode. Thus, the physical characteristics of the edge region can be made to differ from the center region by addition of appropriate dielectric layer over the edge regions or the transducer center region.

As illustrated with reference to FIGS. 13 and 18, the transducer 26 may include a dielectric layer 88 extending longitudinally along the transducer with the dielectric layer covering the electrode portions 58 within the transducer center region 46. As further illustrated with reference to FIG. 14 including a diagrammatical illustration of a resonator 90 having the dielectric layer 88 on top of the electrodes within the center region 46 for both the transducer 26 and adjacent gratings 66, 68 to increase velocity of the acoustic waves within the center region. As further illustrated with reference to FIG. 18, the dielectric layer 88 may extend beyond the transducer boundary as illustrated with reference to the dielectric portions 88a.

By way of example, a silicon oxide layer or overcoat sufficiently covering the transducer will reduce its temperature sensitivity, wherein the length of the edge region is smaller than 1.5 times the acoustic wavelength.

Figure 13:
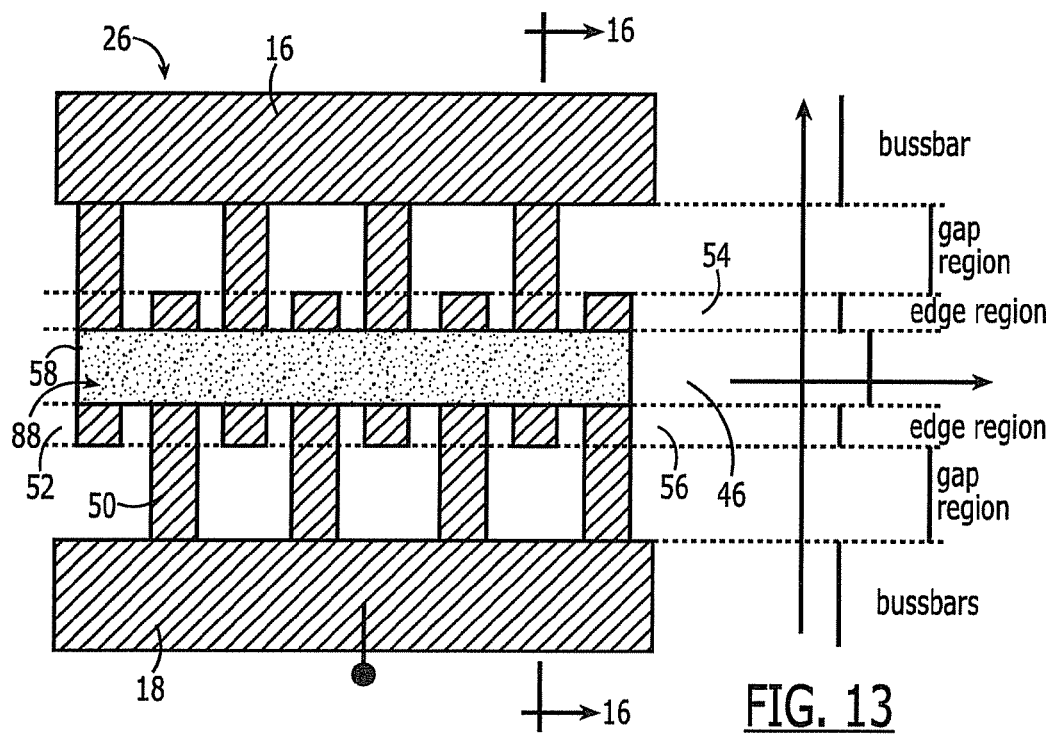
FIG. 13 is a diagrammatical illustration of a transducer without a dummy electrode and with a dielectric or metal layer on top to increase velocity in the center region.
Figure 14:
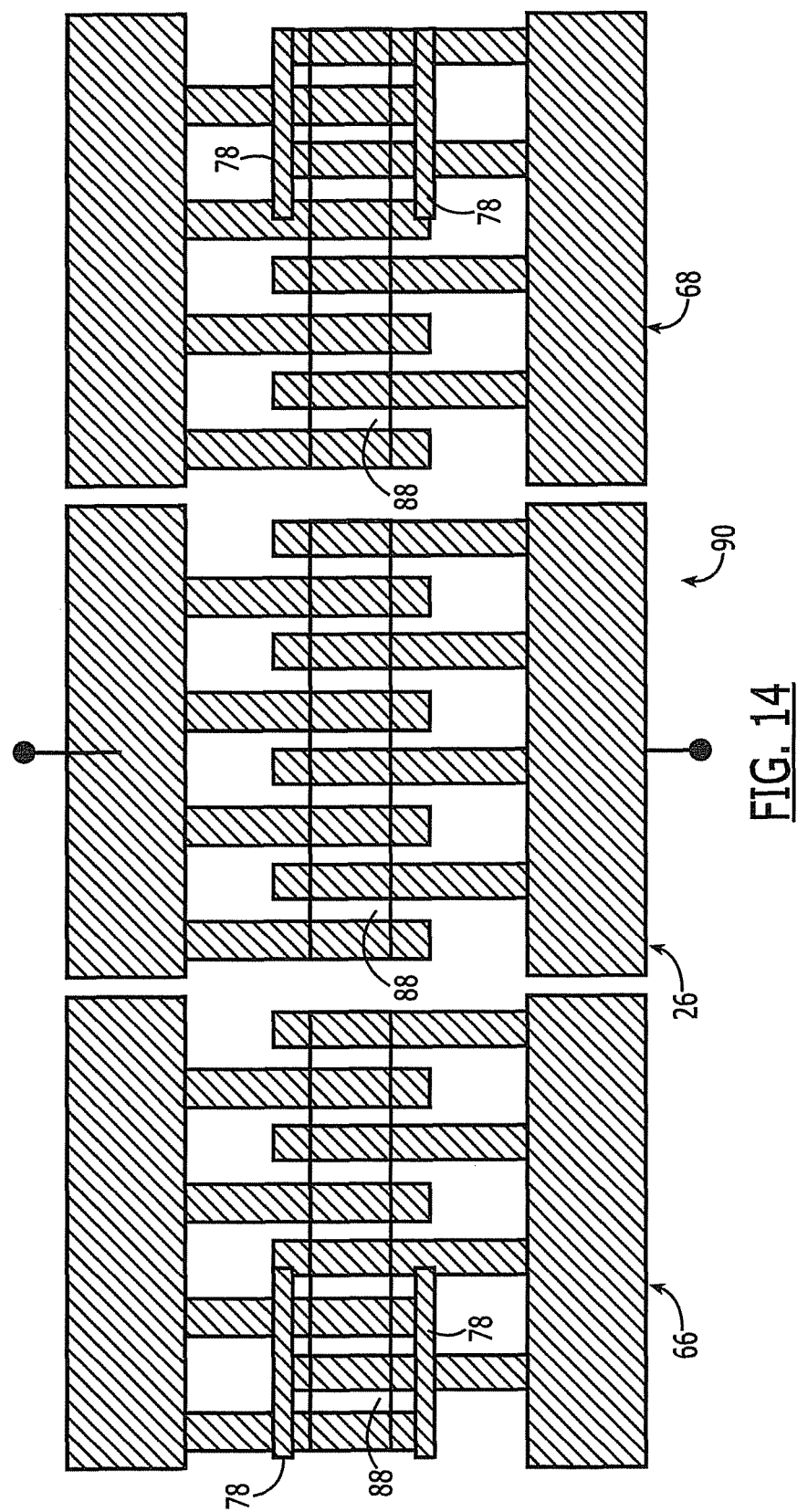
FIG. 14 is a diagrammatical illustration of a resonator without a dummy electrode and with a dielectric layer on top to increase velocity in the center region.

By way of further example, FIG. 14 illustrates one resonator using the configuration of FIG. 13. Again, care is taken to choose reflectors having an acoustic configuration similar to the transducer configuration.

Figure 15:
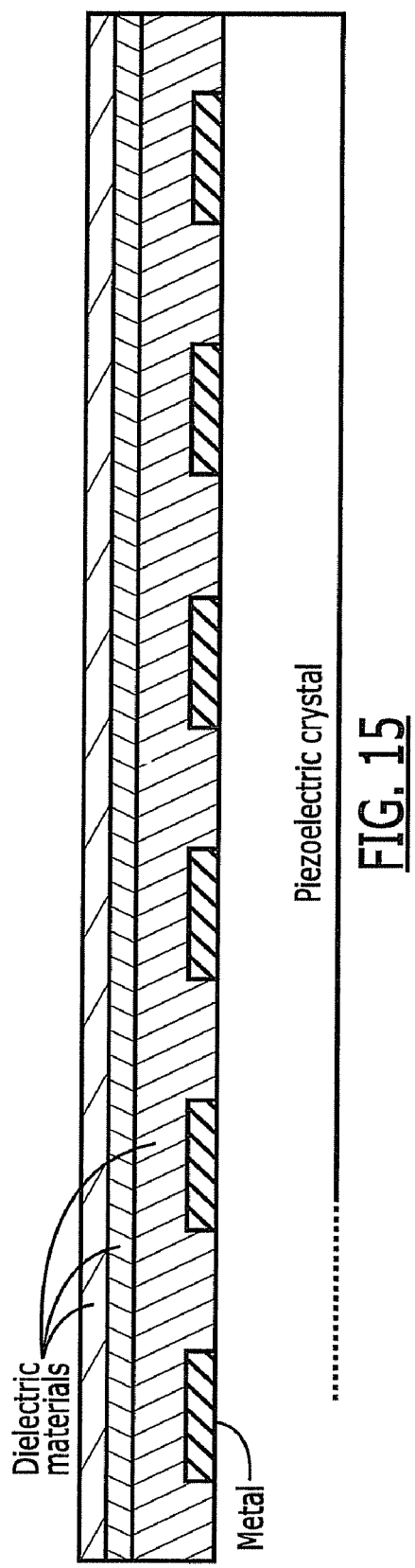
FIG. 15 is a diagrammatical cross section view of a saw device with electrodes buried in a dielectric material ($SiO_x$ by way of example)

FIG. 15 illustrates one buried IDT configuration. In this case, the additional layers to realize the velocity shifts can be deposited on top, as further illustrated with reference to FIG. 16. As illustrated with reference to FIG. 16, the device 10 may further comprise a first dielectric layer 92 covering the transducer 26 and a second dielectric layer 94 extending longitudinally along the transducer and covering only the electrode portions within the transducer center region 46.

Figure 16B:
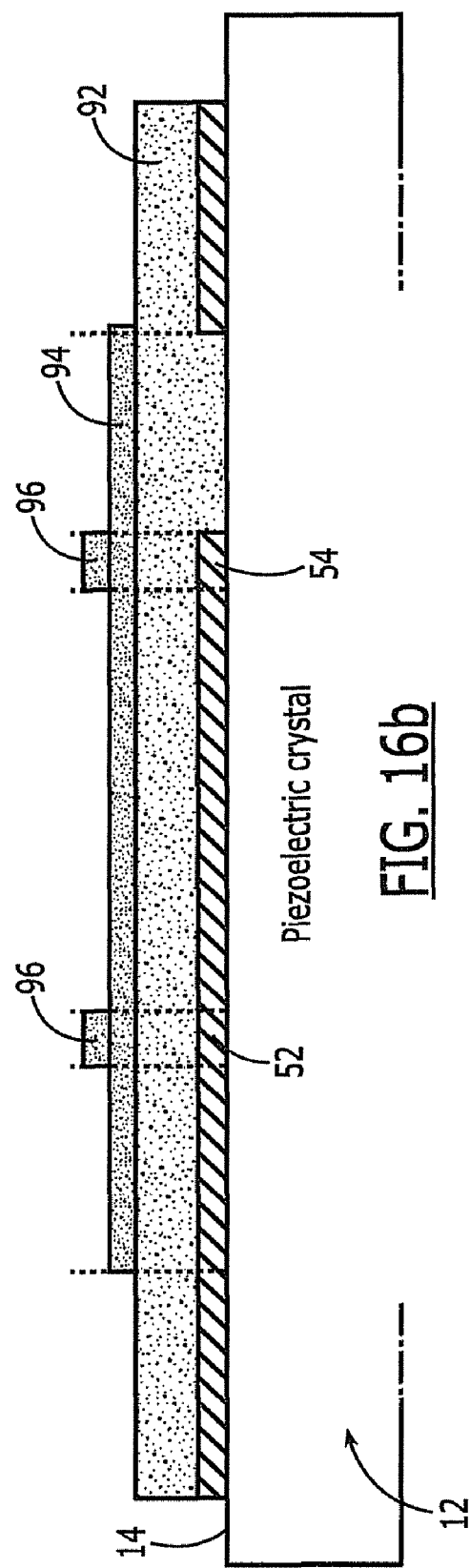
FIG. 16*b* illustrates one embodiment according to the teachings of the present of the invention in cross section along an electrode view of an example of improved device buried in silicon oxide, wherein a slow dielectric material is used to obtain the right velocity configuration, and wherein to ease the frequency trimming process, this fast material is added on the full transducer surface (gap/edge/transducer) while more material is added on the center, and wherein if some slow material is removed, the difference in the thickness of fast material will remain constant and then the velocity difference will stay correct.

Optionally, and with reference to FIGS. 16a and 16b, the device 10 may further comprise the first dielectric layer 92 covering the transducer 26 and the second dielectric layer 94 extending longitudinally along the transducer and covering the electrode portions within the gap regions 38, 40, the edge regions 54, 56 and the center region 46. Further, and as illustrated with continued reference to FIG. 16a, a third dielectric layer 96 may be included that further covers the electrode portion within the center region 46. Yet further, and as illustrated with continued reference to FIG. 16b, the third dielectric layer 96 may be included that covers the electrode within the edge regions.

They could also be deposited directly on the electrodes depending on the desired technological choices. It is desirable to have a velocity profile with a lower acoustic wave velocity in the edges and to choose edge lengths and velocity differences for obtaining an essentially flat mode shape.

It is often necessary to trim the frequency of the filter. Usually this is done by etching some amount of material on the top of the filter. In the case when a layer is added on top of the filter to obtain the desired velocity shift, it may be advantageous to use a configuration similar to that illustrated in FIGS. 16a and 16b. It allows one to decorrelate the center frequency of the device and the level of spurious modes.

As illustrated with reference to FIG. 17, one transducer 26 according to the teachings of the present invention may be as described above with reference to FIGS. 7 and 9, wherein dummy electrodes 98 extending from the opposing busbars 16, 18 are included to form dummy electrode regions 100, 102 adjacent to the busbars to reduce the length of the gap regions 38, 40.

Figure 17:
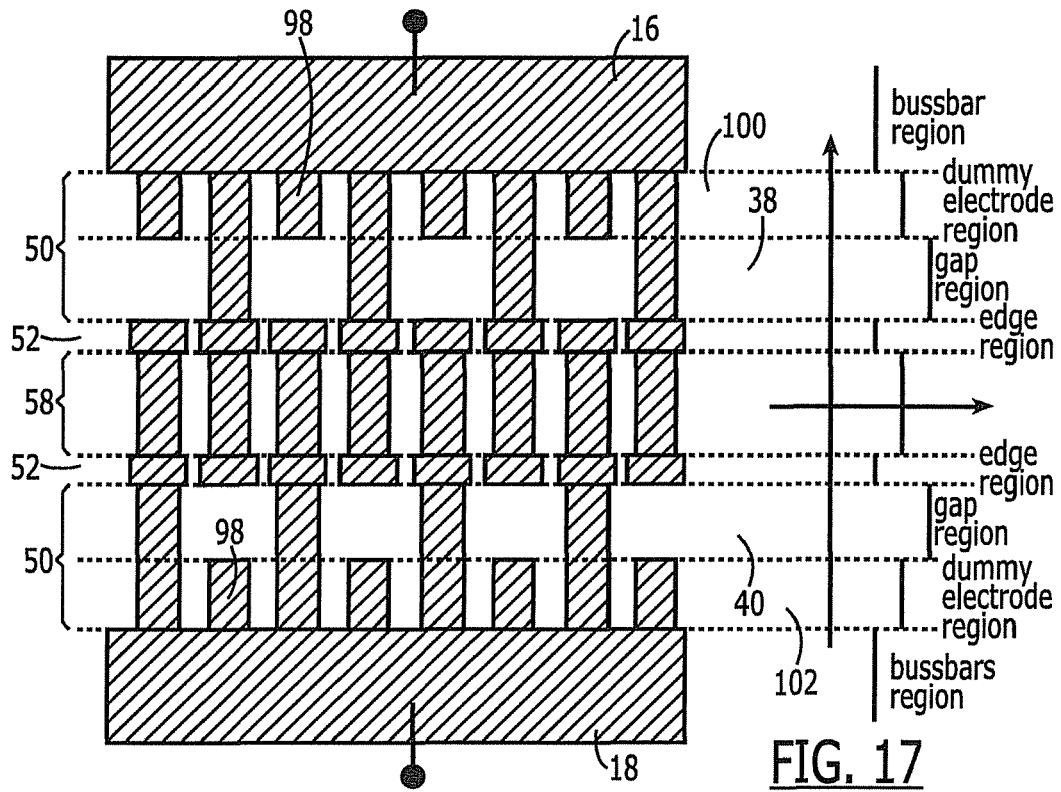
FIG. 17 illustrates an example of a transducer with long edge gap and slower edge region, wherein the electrode width in the gap region is the same as that in the transducer region, and wherein dummy electrodes are present.

FIG. 17 illustrates another embodiment of a transducer of the invention. In this case, dummy electrodes are used. Since the end gaps are long enough, the presence or absence of these dummy electrodes has no impact on performance.

Figure 18:
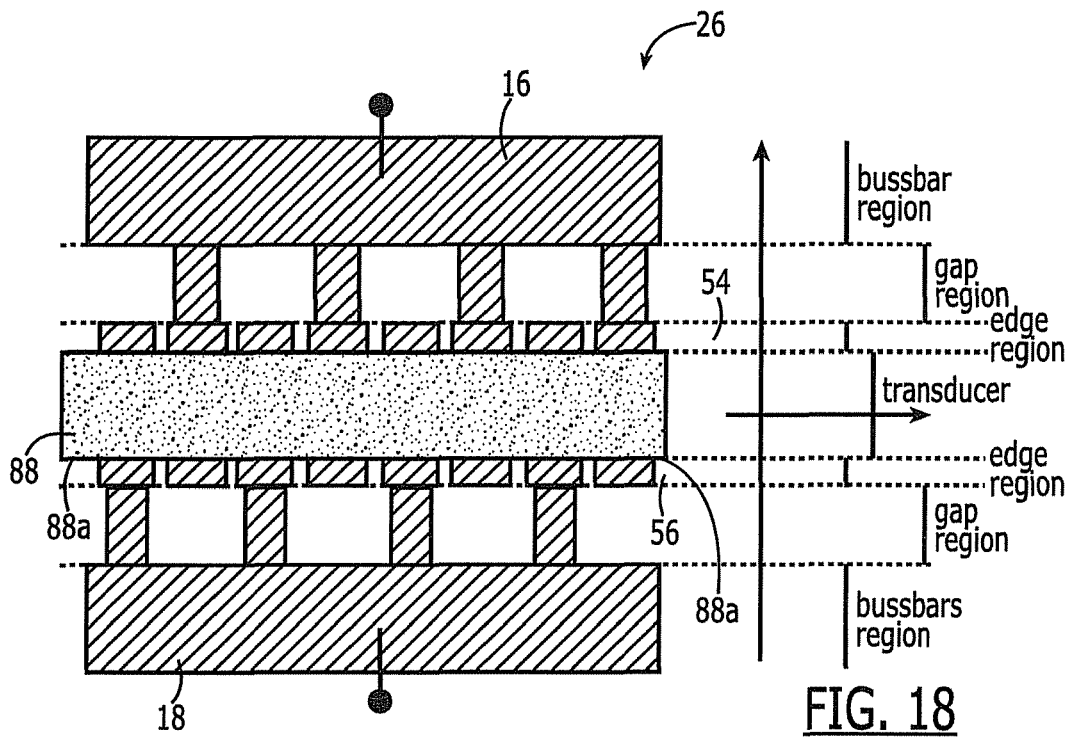
FIG. 18 illustrates one example of a transducer according to the teachings of the present invention with long edge gap and slower edge region, wherein the velocity in the edge region is reduced by increasing the duty factor and the velocity in the center region is increased by adding a dielectric layer on top.

FIG. 18 illustrates another implementation of the invention. In this case, the velocity difference between the transducer aperture center region and the slow region are obtained by both choosing a high duty factor in the slow region and adding a dielectric layer in the center (for example of type silicon nitride). This allows an increase in the velocity difference and while using a smaller edge width. It can also be used for higher frequencies where photolithography resolution limits possible duty factors.

As illustrated with reference to FIG. 19, the electrode portions within the gap, edge and center regions may be structured to form an apodized transducer 26a. Further, and as illustrated with reference to FIG. 20, the electrode portions within the center regions may include equal transverse length dimensions with the edge regions including unequal transverse length dimensions resulting in an apodized edge region structure 54a, 56a. Yet further, each of the electrode portions within the edge regions may have a tapered width dimension as illustrated with reference to FIG. 21. The tapered electrode portions 52t may taper from a first width dimension equal the width dimension of the electrode portions within the center region to a second width dimension equal the width dimension of the electrode portions of the gap regions.

Figure 19:
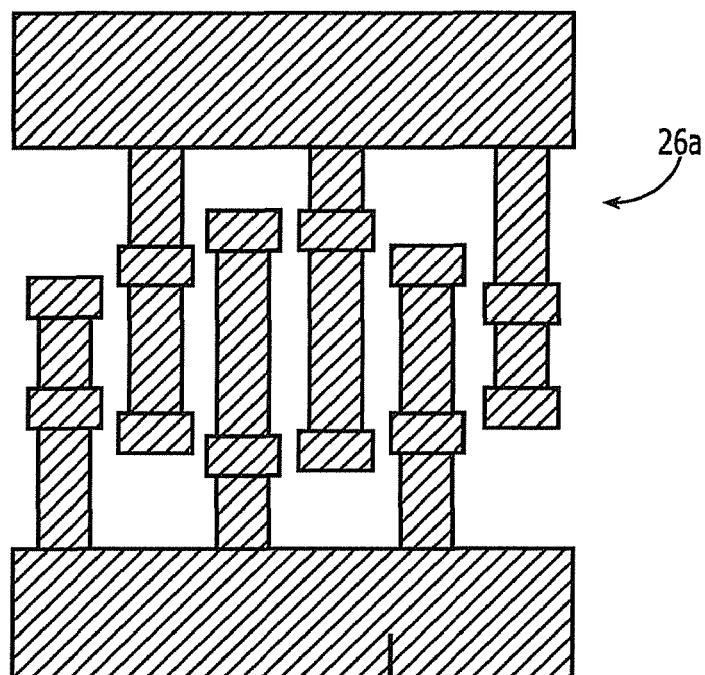
FIG. 19 illustrates one example of a transducer with long edge gap and slower edge region, the transducer has also some apodization to reduce further the level of the transverse modes, but very light apodization is sufficient in this case.
Figure 20:
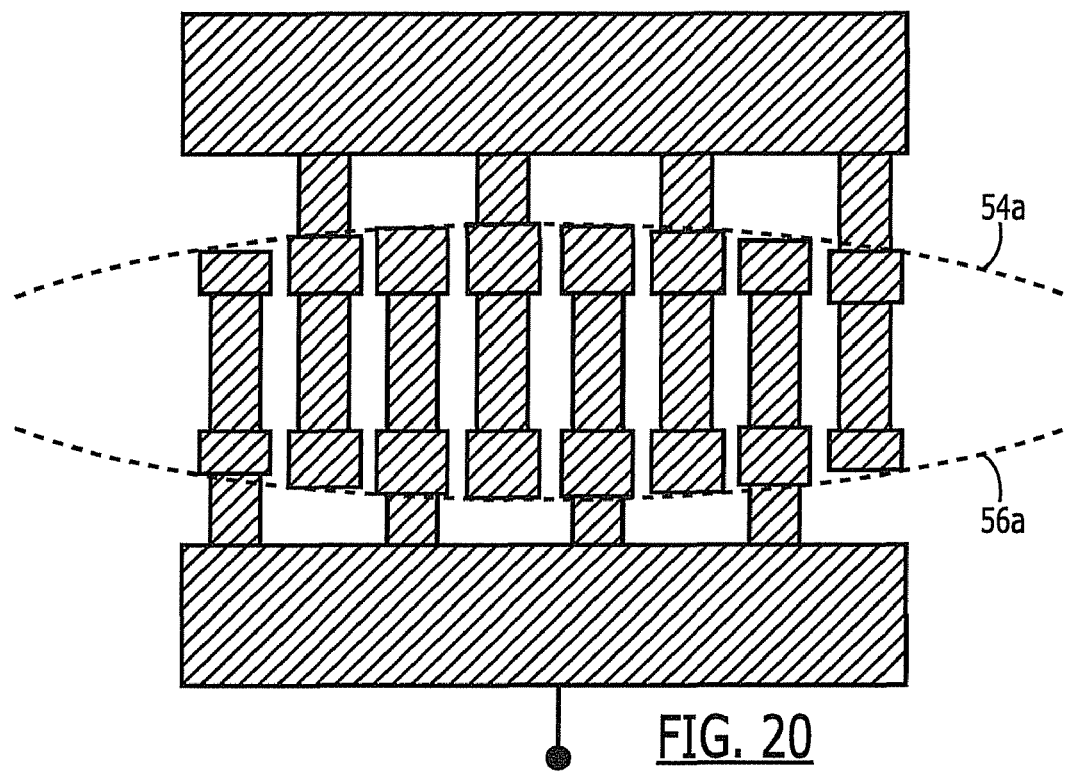
FIG. 20 illustrates one example of a transducer where the slow edge region width is not constant.

FIG. 19 illustrates a transducer having both apodization and a slow edge region with wider finger element portions. Most of the modes are suppressed by using the slow region, but a very small apodization will help to suppress the remaining spurii. In this case, the needed apodization is much smaller than when no slow region is used, thus the coupling factor stays larger. Further, the width of the slow velocity edge can be modulated along the transducer as illustrated with reference to FIG. 20.

Figure 21:
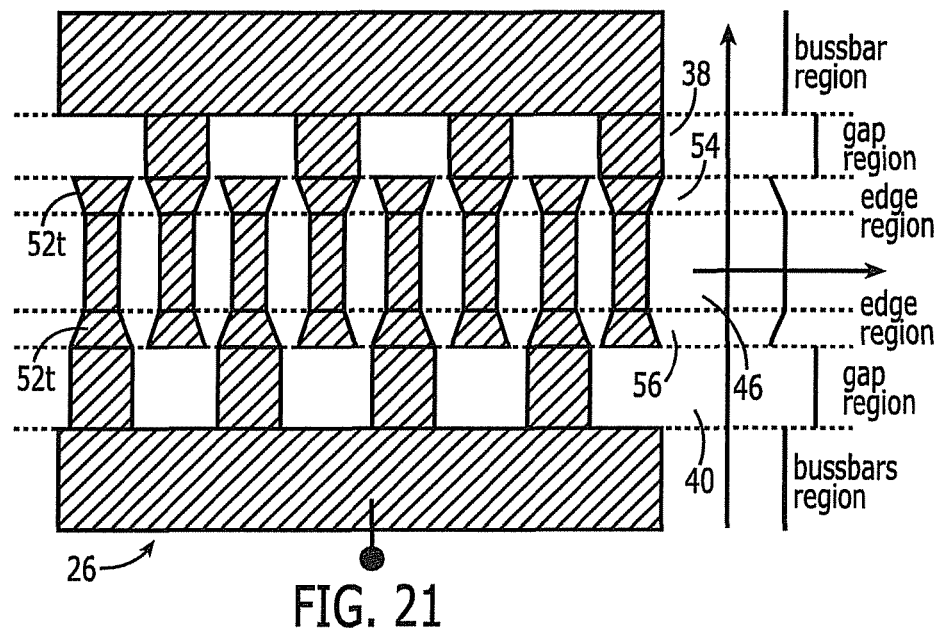
FIG. 21 is an example of one transducer with long edge gap and slower edge region, wherein the slower region does not have a constant velocity.

FIG. 21 illustrates an example of a transducer for which the velocity in the slow velocity edge region is not constant. In this case, the duty factor is varying in the region by a tapering of finger element portions in the edge region. Similar behavior can be obtained as in the case where the velocity is constant as long as the velocity in the edge region is slower than the velocity in the center region and the velocity in the gap edge region. The slow edge region width can be adjusted in order to obtain a flat transverse mode. Similarly, the center region can have a non-constant velocity as well as the gap edge region.

Figure 22:
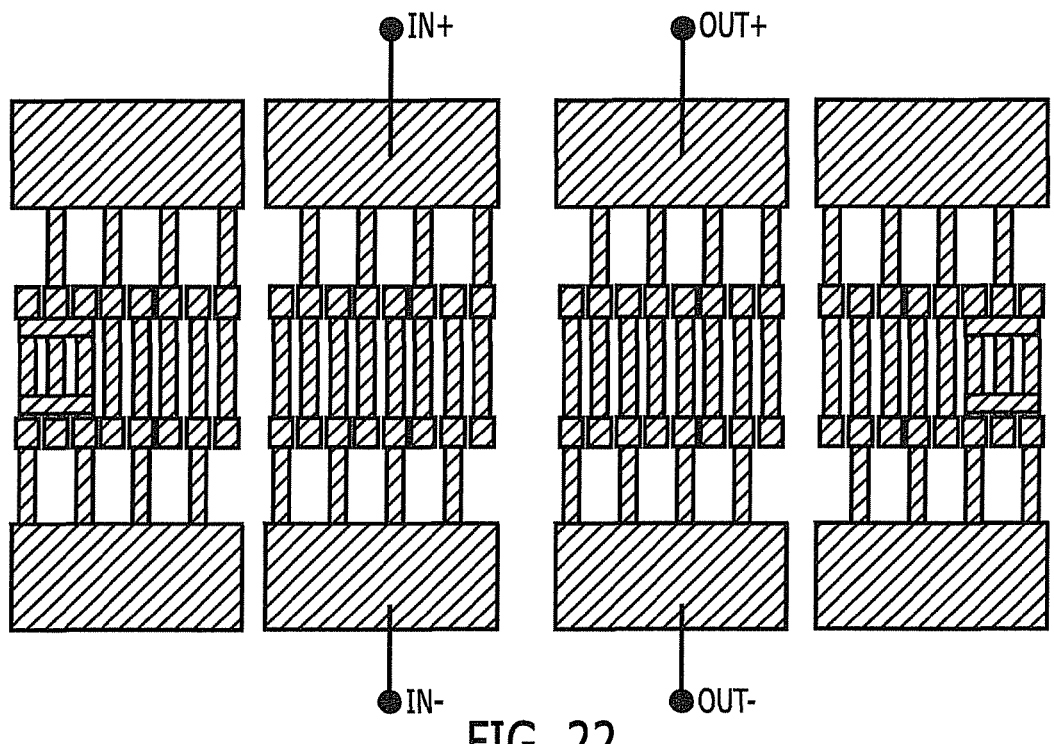
FIG. 22 illustrates one example of a two transducers coupled resonator filter with mode suppression.
Figure 23:
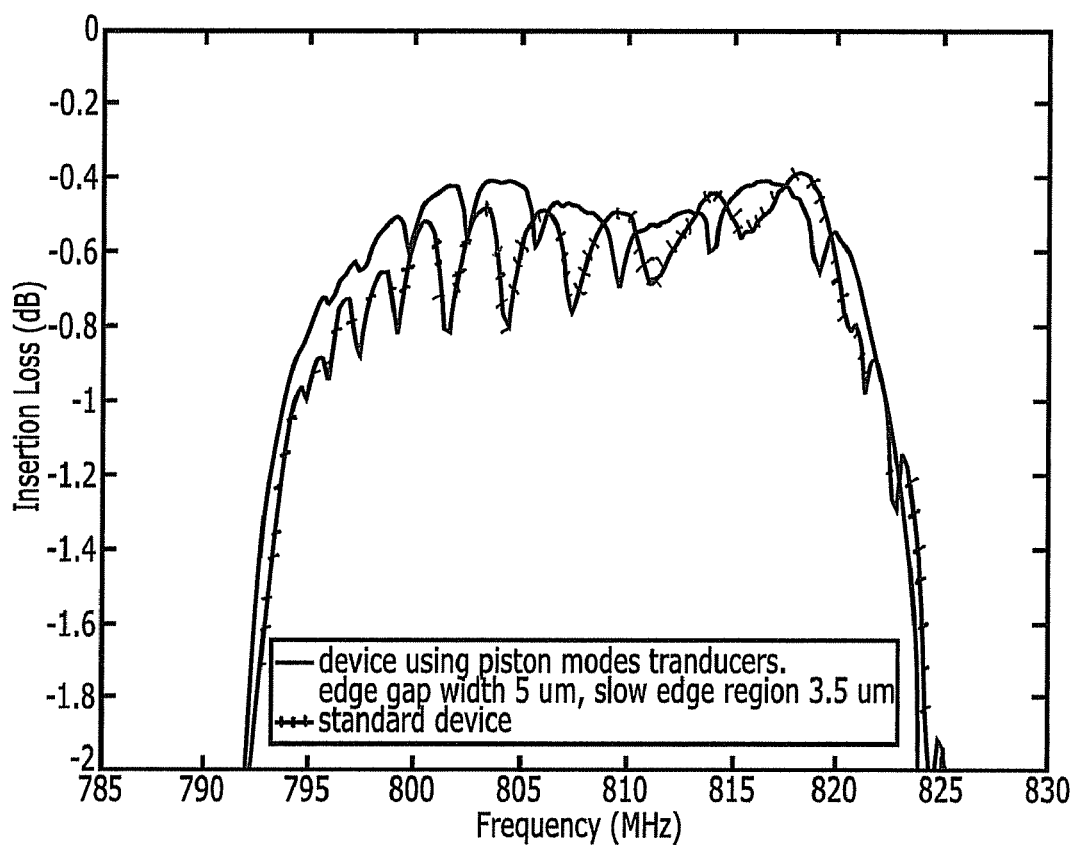
FIG. 23 is a comparison of a transfer function for a standard device and a device using piston modes transducers according to the teachings of the present invention.
Figure 24:
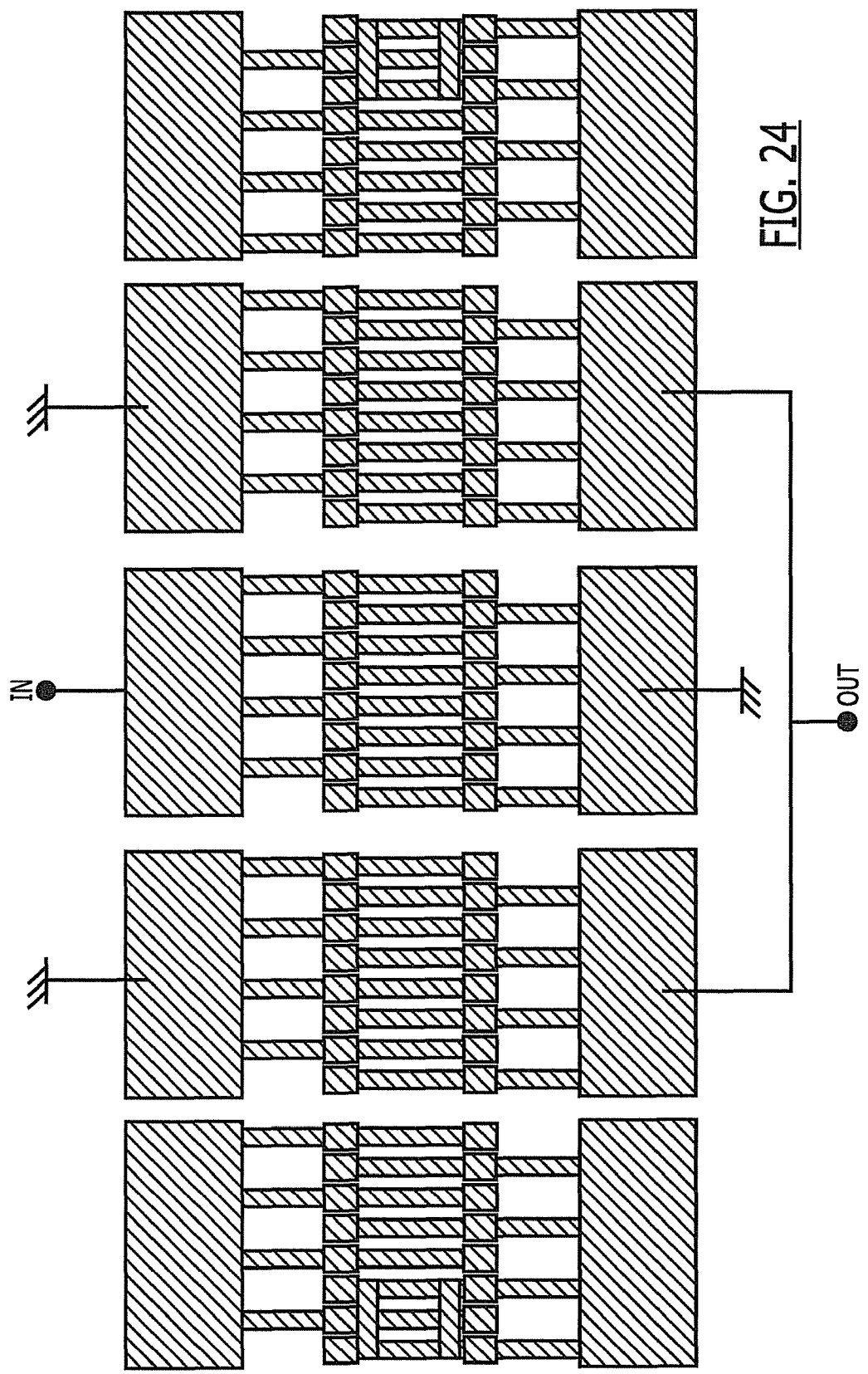
FIG. 24 illustrates one example of a three transducers coupled resonator filter with mode suppression according to the teachings of the present invention.
Figure 25B:
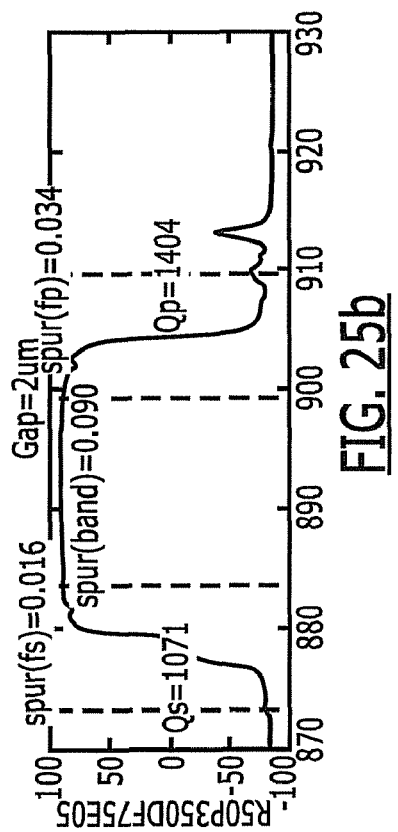
FIG. 25 illustrates results obtained for a piston mode resonator of the present invention, wherein various lengths of the gap edge are illustrated, and wherein the plots shown are the phase of the impedance, the Q at resonance, as well as the Q at antiresonance, the period of the resonator is 2 um corresponding to a wavelength of 4 um, the mode on the low side disappear for a gap length of 1 lambda, and the quality factor are as desired for a gap length of 3 lambda and remain as desired for larger gaps lengths.
Figure 25D:
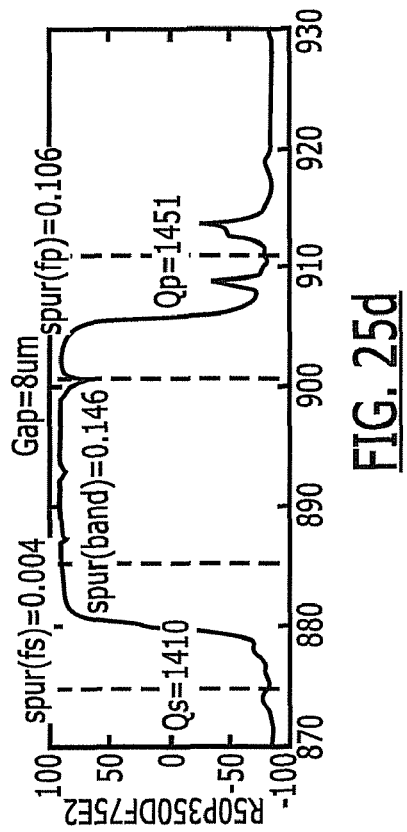
Figure 25A:
Figure 25C:
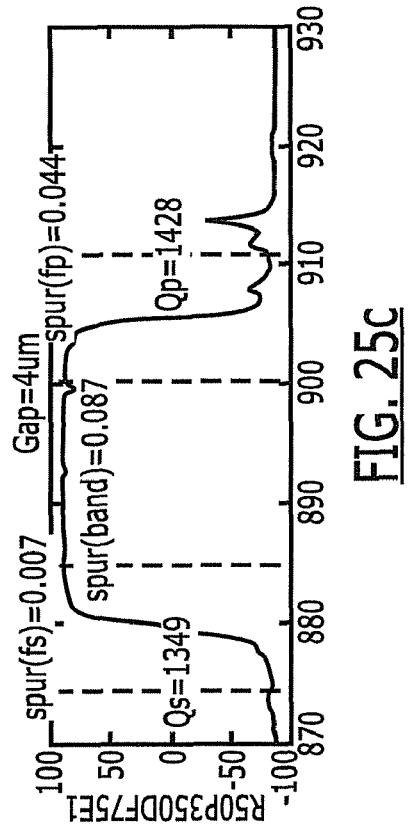
Figure 25E:
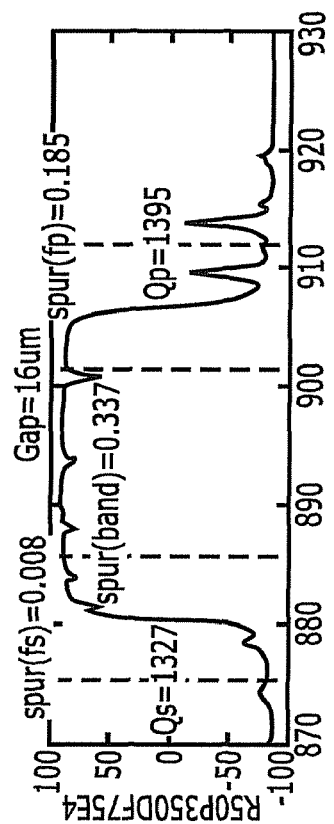
Figure 25F:
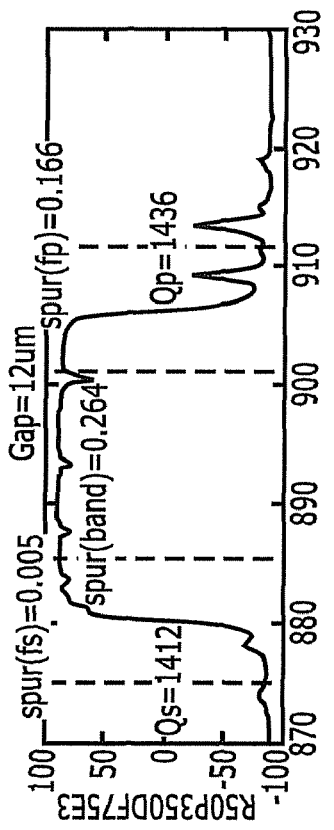
Figure 25G:
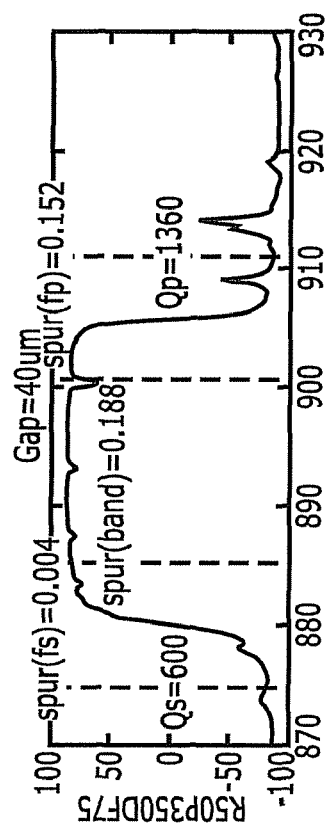
Figure 25H:
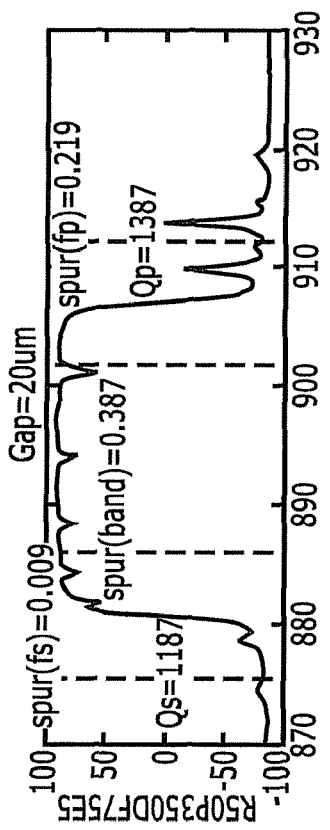

FIG. 22 illustrates an implementation of a coupled resonator filter according to the teachings of the present invention. In this case two transducers are used. FIG. 23 illustrates results obtained for a coupled resonator filter with and without piston mode transducers. It is seen very clearly that the ripple and insertion loss are reduced for embodiments of the invention herein described by way of example. Having the benefit of the teachings of the present invention, one of skill in the art may develop yet more transducers to be used to obtain desired frequency characteristics. For example, FIG. 24 illustrates a configuration using three transducers. Similarly five or more transducers can be used, as known. It has also been noted that several sections of CRF can be cascaded or sections of CRFs can be cascaded with resonators elements. In addition, only regular two electrodes per wavelengths SAW transducers were described but the invention applies for any kind of transducer like a SPUDT for example.

FIG. 25 illustrates results obtained for a piston mode resonator of the present invention, wherein the gap edge length is changed, the curve shown is the phase of the impedance, the Q at resonance as well as the Q at antiresonance are shown on the curve, the period of the resonator is 2 um corresponding to a wavelength of 4 um, the mode on the low side disappear for a gap length of 1 lambda, and the quality factor are as desired for a gap length of 2 lambda and remain as desired for larger gaps lengths.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. An acoustic wave device comprising:
   a piezoelectric substrate having a surface for supporting an acoustic wave;
   a first elongate busbar and an opposing second elongate busbar;
   a plurality of first electrodes electrically connected to and extending transversely from the first busbar; and
   a plurality of second electrodes electrically connected to and extending from the second busbar, wherein the opposing busbars and the plurality of electrodes form an interdigital transducer carried on the surface of the piezoelectric substrate, wherein each of the plurality of electrodes has a first end electrically connected to one of the first and second busbars and an opposing second end having an edge spaced from the opposing busbar so as to form a gap between the edge of each electrode and the opposing busbar, the gaps proximate the opposing busbars forming a gap region extending longitudinally along the transducer, wherein the gap length dimension is at least one acoustic wavelength, each electrode within the plurality of electrodes is further defined by a first transversely extending portion proximate the electronically connected busbar and generally contained within the gap region, a second transversely extending portion proximate the edge and defining an edge region extending longitudinally along the transducer, and a third transversely extending portion of the electrode therebetween, the third transversely extending portion within a transducer center region, the second transversely extending portions within the edge regions, respectively, having a physical characteristic that is different than the third transversely extending portion within the transducer center region so as to provide a wave velocity of the acoustic wave within the longitudinally extending edge regions to be less than the wave velocity within the transducer center region, and wherein the wave velocity within the opposing gap regions is greater than a velocity in the transducer center region.

2. The acoustic wave device according to claim 1, wherein the second transversely extending portion within the opposing edge regions has a width dimension greater than a width dimension of the first and third transversely extending portions within the gap and transducer center regions, respectively, so as to provide an increased duty factor.

3. The acoustic wave device according to claim 1, further comprising a plurality of dummy electrodes each extending from the opposing busbars so as to form dummy electrode regions adjacent to the opposing busbars.

4. The acoustic wave device according to claim 1, further comprising first and second gratings carried on the surface of the substrate on opposing longitudinal ends of the interdigital transducer.

5. The acoustic wave device according to claim 4, wherein preselected electrodes within the gratings and most removed from the transducer are electrically connected so at to be short circuited.

6. The acoustic wave device according to claim 4, wherein electrodes within each of the first and second gratings are structured as the electrodes within the transducer.

7. The acoustic wave device according to claim 1, further comprising at least one of a dielectric layer and a metal layer extending longitudinally along the transducer, the layer only covering the electrode portions within the transducer center region, wherein the layer results in an increased velocity of the acoustic wave within the center region.

8. The acoustic wave device according to claim 1, wherein the electrode portions within the gap, edge and center regions form an apodized transducer.

9. The acoustic wave device according to claim 1, wherein the electrode portions within the center regions have equal transverse length dimensions and the edge regions have unequal transverse length dimensions resulting in an apodized edge region structure for the transducer.

10. The acoustic wave device according to claim 1, wherein each of the electrode portions within the edge regions have a tapered width dimension.

11. The acoustic wave device according to claim 10, wherein the tapered electrode portions taper from a first width dimension equal the width dimension of the electrode portions within the center region to a second width dimension equal the width dimension of the electrode portions of the gap regions.

12. The acoustic wave device according to claim 1, wherein the gap length dimension is larger than three acoustic wavelengths.

13. The acoustic wave device according to claim 1, further comprising at least one of a dielectric layer and a metal layer extending longitudinally along the transducer, the layer only covering the electrode portions within the transducer edge region, wherein the layer results in an decreased velocity of the acoustic wave within the edge region.

14. The acoustic wave device according to claim 1, further comprising a silicon oxide overcoat sufficiently covering the transducer to reduce a temperature sensitivity thereof.

15. The acoustic device according to claim 14, wherein the length of the edge is smaller than 1.5 times the acoustic wavelength.

16. The acoustic wave device according to claim 1, wherein the electrodes are formed from a metal having a higher density than aluminum.

17. The acoustic wave device according to claim 1, wherein the electrodes comprise copper.

18. The acoustic wave device according to claim 1, wherein the piezoelectric substrate comprises Lithium Niobate having an orientation between Y+120 deg and Y+136 deg.

19. The acoustic wave device according to claim 1, wherein a duty factor of electrode portions in the edge regions is between 70% and 80%.

20. An surface acoustic wave device comprising:
a piezoelectric substrate having a surface for propagating acoustic waves;
a first elongate busbar and an opposing second elongate busbar extending generally along a longitudinal path of the acoustic waves;
a plurality of first electrodes electrically connected to and extending from the first busbar;
a plurality of second electrodes electrically connected to and extending from the second busbar, wherein the opposing busbars and the plurality of electrodes form an interdigital transducer carried on the piezoelectric substrate for the propagating acoustic waves, wherein each of the plurality of the electrodes has a first end electrically connected to one of the first and second busbars and an opposing second end having an edge spaced from the opposing busbar so as to form a gap between the edge of each electrode and the opposing busbar, the gaps proximate the opposing busbars forming a gap region extending longitudinally along the transducer, and wherein a length dimension of the gap is at least a wavelength of the propagating acoustic waves; and
a first layer covering the transducer, a second layer extending longitudinally along the transducer, the second layer covering the electrode portions within the edge regions, wherein a velocity of the acoustic waves within opposing gap regions is greater than a velocity in a transducer center region between the gap regions, and wherein the wave velocity of the edge region is less than the wave velocity of the center region, the layers formed from at least one of a dielectric material and a metal material.

21. An surface acoustic wave device comprising:
a piezoelectric substrate having a surface for propagating acoustic waves;
a first elongate busbar and an opposing second elongate busbar extending generally along a path of the acoustic waves;
a plurality of first electrodes electrically connected to and extending from the first busbar;
a plurality of second electrodes electrically connected to and extending from the second busbar, wherein the opposing busbars and the plurality of electrodes form an interdigital transducer carried on the piezoelectric substrate for the propagating acoustic waves, and wherein each of the plurality of the electrodes has a first end electrically connected to one of the first and second busbars and an opposing second end having an edge spaced from the opposing busbar so as to form a gap between the edge of each electrode and the opposing busbar, the gaps proximate the opposing busbars forming opposing gap regions extending longitudinally along the transducer, and wherein a length dimension of the gap within each of the opposing gap regions is at least a wavelength for the propagating acoustic waves;
each electrode within the plurality of electrodes is further defined by a first transversely extending portion proximate the electronically connected busbar and generally contained within the gap regions, a second transversely extending portion proximate the edge and defining the edge regions extending longitudinally along the transducer, and a third transversely extending portion of the electrode therebetween, the third transversely extending portion defined within a transducer center region;
a first layer covering the transducer; and
a second layer extending longitudinally along the transducer, the second layer covering only electrode portions within a transducer center regions,
wherein a velocity of the acoustic waves within opposing gap regions is greater than a velocity in a transducer center region between the gap regions, and wherein the wave velocity of the edge region is less than the wave velocity of the center region, the layers formed from at least one of a dielectric material and a metal material.

22. The acoustic wave device according to claim 21, further comprising a third layer covering electrode portions within the gap, edge and center regions.

23. The acoustic wave device according to claim 20, further comprising a third layer covering electrode portions within the gap, edge and center regions.

* * * * *